(12) United States Patent
Moriwaki

(10) Patent No.: US 10,211,145 B2
(45) Date of Patent: Feb. 19, 2019

(54) IMAGING ELEMENT, SOLID-STATE IMAGING DEVICE, AND ELECTRONIC DEVICE HAVING FIRST AND SECOND BUFFER LAYERS

(71) Applicant: SONY CORPORATION, Tokyo (JP)

(72) Inventor: Toshiki Moriwaki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/509,282

(22) PCT Filed: Jun. 16, 2015

(86) PCT No.: PCT/JP2015/067304
§ 371 (c)(1),
(2) Date: Mar. 7, 2017

(87) PCT Pub. No.: WO2016/042866
PCT Pub. Date: Mar. 24, 2016

(65) Prior Publication Data
US 2017/0278784 A1 Sep. 28, 2017

(30) Foreign Application Priority Data

Sep. 16, 2014 (JP) .................................. 2014-188216

(51) Int. Cl.
*H01L 27/14* (2006.01)
*H01L 31/10* (2006.01)
(Continued)

(52) U.S. Cl.
CPC ........ *H01L 23/522* (2013.01); *H01L 21/3205* (2013.01); *H01L 27/14* (2013.01);
(Continued)

(58) Field of Classification Search
CPC ... H01L 21/3205; H01L 23/522; H01L 27/14; H01L 27/1462; H04N 5/374
See application file for complete search history.

(56) References Cited

U.S. PATENT DOCUMENTS

2005/0037232 A1* 2/2005 Tyan .................... H01L 27/3211
428/690
2008/0035965 A1* 2/2008 Hayashi ............ H01L 27/14647
257/291
(Continued)

FOREIGN PATENT DOCUMENTS

JP 2002-260857 A 9/2002
JP 2008-72090 A 3/2008
(Continued)

OTHER PUBLICATIONS

International Search Report prepared by the Japan Patent Office dated Jan. 20, 2015, for International Application No. PCT/JP2015/067304.

*Primary Examiner* — Amy R Hsu
(74) *Attorney, Agent, or Firm* — Sheridan Ross P.C.

(57) ABSTRACT

An imaging element includes a layered structural body formed of a first electrode, a light receiving layer formed on the first electrode, and a second electrode formed on the light receiving layer, and a single first buffer layer formed of an amorphous organic material and a single second buffer layer formed of an amorphous inorganic material are provided between the light receiving layer and the second electrode from the light receiving layer side.

19 Claims, 12 Drawing Sheets

(51) Int. Cl.
*H04N 5/374* (2011.01)
*H01L 23/522* (2006.01)
*H01L 27/146* (2006.01)
*H01L 21/3205* (2006.01)

(52) U.S. Cl.
CPC ............ *H01L 27/146* (2013.01); *H01L 31/10* (2013.01); *H01L 27/1462* (2013.01); *H04N 5/374* (2013.01)

(56) References Cited

U.S. PATENT DOCUMENTS

| | | | |
|---|---|---|---|
| 2010/0244030 A1* | 9/2010 | Sawaki | H01L 27/14601 257/53 |
| 2010/0308372 A1* | 12/2010 | Mitsui | B82Y 10/00 257/184 |
| 2010/0320391 A1* | 12/2010 | Antonuk | H01L 27/1462 250/366 |
| 2011/0049492 A1* | 3/2011 | Sawaki | B82Y 10/00 257/40 |
| 2011/0074491 A1* | 3/2011 | Yofu | B82Y 10/00 327/514 |

FOREIGN PATENT DOCUMENTS

| | | |
|---|---|---|
| JP | 2009-290114 A | 12/2009 |
| JP | 2010-98249 A | 4/2010 |
| JP | 2011-253861 A | 12/2011 |
| JP | 2013-55252 A | 3/2013 |
| JP | 2014-120616 A | 6/2014 |

\* cited by examiner

IMAGING ELEMENT, SOLID-STATE IMAGING DEVICE, AND ELECTRONIC DEVICE HAVING FIRST AND SECOND BUFFER LAYERS

CROSS REFERENCE TO RELATED APPLICATIONS

This application is a national stage application under 35U.S.C. 371and claims the benefit of PCT Application No. PCT/JP2015/067304 having an international filing date of 16 Jun. 2015, which designated the United States, which PCT application claimed the benefit of Japanese Patent Application No. 2014-188216 filed 16 Sep. 2014, the disclosures of which are incorporated herein by reference in their entirety.

TECHNICAL FIELD

The present disclosure relates to an imaging element, a solid-state imaging device, and an electronic device.

BACKGROUND ART

An imaging element constituting an image sensor and the like has a structure in which, for example, a light receiving layer (photoelectric conversion layer) is interposed between two electrodes. In this kind of imaging element, a transparent electrode through which light enters is normally formed of ITO having crystallinity. However, such a transparent electrode having crystallinity has large inner stress and causes stress damage on the light receiving layer and may often deteriorate characteristics of the imaging element. There is a known imaging element (photoelectric converting element) disclosed in, for example, Japanese Patent Application Laid-Open No. 2010-003901 A in order to solve a problem caused by such inner stress of the transparent electrode. In other words, the imaging element (photoelectric converting element) disclosed in this Patent Application Laid-Open Publication includes: a photoelectric conversion layer disposed between a pair of electrodes; and at least one stress buffer layer interposed between one of the pair of electrodes and the photoelectric conversion layer, and the stress buffer layer has a layered structure including a crystalline layer, more specifically, a structure having two alternations of the crystalline layer and an amorphous layer (total four layers).

CITATION LIST

Patent Document

Patent Document 1: Japanese Patent Application Laid-Open No.: 2010-003901 A

SUMMARY OF THE INVENTION

Problems to be Solved by the Invention

However, according to a technology disclosed in above-described Japanese Patent Application Laid-Open Publication, a stress buffer layer has at least a four-layer structure, and the structure is complex. Therefore, there maybe problems in which a forming process may be complex and a long time may be required to form the stress buffer layer.

Therefore, the present disclosure is directed to providing an imaging element, a solid-state imaging device including such an imaging element, and an electronic device, in which stress damage is hardly caused on a light receiving layer in spite of having a simple structure.

Solutions to Problems

An imaging element of the present disclosure to achieve the above-described object includes a layered structural body formed of : a first electrode; a light receiving layer formed on the first electrode; and a second electrode formed on the light receiving layer, and a single first buffer layer formed of an amorphous organic material and a single second buffer layer formed of an amorphous inorganic material are provided between the light receiving layer and the second electrode from the light receiving layer side.

A solid-state imaging device of the present disclosure to achieve the above-described object includes a plurality of imaging elements, each of the imaging elements includes a layered structural body formed of: a first electrode; a light receiving layer formed on the first electrode; and a second electrode formed on the light receiving layer, and a single first buffer layer formed of an amorphous organic material and a single second buffer layer formed of an amorphous inorganic material are provided between the light receiving layer and the second electrode from the light receiving layer side.

An electronic device of the present disclosure to achieve the above-described object includes: a light emitting/light receiving layer; a first electrode electrically connected to the light emitting/light receiving layer; and a second electrode formed on the light emitting/light receiving layer and formed of a transparent conductive material, and a single first buffer layer formed of an amorphous organic material and a single second buffer layer formed of an amorphous inorganic material are provided between the light emitting/light receiving layer and the second electrode from the light emitting/light receiving layer side.

Effects of the Invention

In the imaging element of the present disclosure, the imaging element in the solid-state imaging device of the present disclosure or the electronic device of the present disclosure, the single first buffer layer formed of the amorphous organic material is provided between the light receiving layer or the light emitting/light receiving layer and the second electrode. Therefore, the light receiving layer or the light emitting/light receiving layer is hardly damaged at the time of forming the second buffer layer. Additionally, since the single second buffer layer formed of the amorphous inorganic material is provided, stress damage is hardly caused on the light receiving layer or the light emitting/light receiving layer at the time of forming the second electrode. Furthermore, as a result thereof, there is no risk of causing characteristic deterioration of the imaging element and the electronic device. Additionally, because of having a two-layer structure including the first buffer layer and the second buffer layer, a forming process is simplified and a forming time can be shortened. Note that the effects recited in the present specification are only examples and not limited thereto, and furthermore, an additional effect may also be provided.

MODE FOR CARRYING OUT THE INVENTION

Figure 1A:
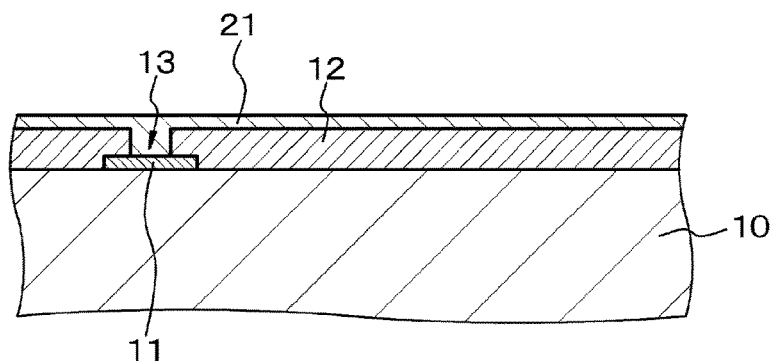
FIGS. 1A and 1B are schematic partial cross-sectional views of a substrate and the like to describe a manufacturing method of an imaging element and an electronic device of Example 1.

In the following, the present disclosure will be described on the basis of Examples with reference to the drawings, but note that the present disclosure is not limited to such Examples, and various kinds of values and materials in Examples are examples. Note that a description will be provided in the following order.
1. Description for Imaging Element, Electronic Device, and General Matters of Present Disclosure
2. Example 1 (Imaging Element and Electronic Device)
3. Example 2 (Modified Example of Example 1)
4. Example 3 (Solid-State Imaging Device of Present Disclosure)
5. Others <Description for Imaging Element, Electronic Device, and General Matters of Present Disclosure>

A second buffer layer may have a form made of a metal oxide or an oxide semiconductor in an imaging element of the present disclosure, an imaging element in a solid-state imaging device of the present disclosure, or an electronic device of the present disclosure (hereinafter may also be collectively referred to as "imaging elements and the like of the present disclosure"). Furthermore, in this case, the second buffer layer may have a form made of at least two kinds of materials selected from a group consisting of a zinc oxide, a silicon oxide, a tin oxide, a niobium oxide, a titanium oxide, a molybdenum oxide, an aluminum oxide, an indium-doped gallium-zinc oxide (IGZO), a magnesium oxide, and a hafnium oxide, and thus the second buffer layer having excellent transparency and also having a high energy barrier can be obtained. Here, the second buffer layer preferably has a form made of a zinc oxide and an aluminum oxide (e.g., 0.1 mass % to 2 mass %) and a magnesium oxide (e.g., 1 mass % to 25 mass %), or a zinc oxide and an aluminum oxide (e.g., 0.1 mass % to 2 mass %) and a silicon oxide (e.g., 1 mass % to 25 mass %) in terms of the transparency, a height of the energy barrier, and easy forming.

In the imaging element and the like of the present disclosure including the above-described preferable forms, the second buffer layer may have a form having a thickness of $3 \times 10^{-9}$ m to $3 \times 10^{-7}$ m.

Furthermore, in the imaging element and the like of the present disclosure including the above-described various kinds of preferable forms, the second buffer layer preferably has a sheet resistance value of $1 \times 10^5$ $\Omega/\square$ or more in terms of ensuring insulation.

Moreover, in the imaging element and the like of the present disclosure including the above-described various kinds of preferable forms, the first buffer layer is preferably formed of phenanthroline and a derivative thereof or anthracene and a derivative thereof but not limited thereto, and for example, the first buffer layer may be formed of a material in which an energy barrier between the first buffer layer and the light receiving layer or the light emitting/light receiving layer is 0.2 eV or less and an energy barrier between the first buffer layer and the second buffer layer is 0.2 eV or less.

Additionally, in the imaging element and the like of the present disclosure including the above-described various kinds of preferable forms, the first buffer layer may have a form having a thickness of $3 \times 10^{-9}$ m to $3 \times 10^{-7}$ m.

Furthermore, in the imaging element and the like of the present disclosure including the above-described various kinds of preferable forms, the second electrode may have a form made of an amorphous oxide that is transparent and has conductivity.

Furthermore, in the imaging element and the like of the present disclosure including the above-described various kinds of preferable forms, the second electrode may have a form made of a material obtained by adding or doping at least one kind of material selected from a group consisting of aluminum, gallium, tin, and indium to one kind of material selected from a group consisting of an indium oxide, a tin oxide, and a zinc oxide. Additionally, in this case, the second electrode has a work function value of 4.5 eV or less, preferably, 4.1 eV to 4.5 eV.

Alternatively, in the imaging element and the like of the present disclosure including the above-described various kinds of preferable forms, the second electrode has a constitution made of $In_a(Ga, Al)_b Zn_c O_d$, namely, a constitution made of an amorphous oxide including at least a four-element based compound of indium (In), gallium (Ga) and/or aluminum (Al), zinc (Zn), and oxygen (O). Additionally, in this case, a difference between a work function value of the second electrode and a work function value of a first electrode is preferably 0.4 eV or more, and furthermore, since the difference between the work function value of the second electrode and the work function value of the first electrode is set to 0.4 eV or more, it may be possible to achieve a constitution in which an internal electric field is generated in the light receiving layer or the light emitting/light receiving layer (hereinafter may be collectively referred to as "light receiving layer and the like") on the basis of the difference of the work function value at the time of applying bias voltage between the second electrode and the first electrode, and internal quantum efficiency is improved. Also, generation of dark current can be more effectively suppressed. Here, control of the work function value of the above-described second electrode may be achieved by controlling an introduced amount of oxygen gas (oxygen gas partial pressure) at the time of formation on the basis of a sputtering method.

Specifically, the second electrode may have a form made of a transparent conductive material such as an indium-gallium oxide (IGO), an indium-doped gallium-zinc oxide (IGZO, In—GaZnO$_4$), an aluminum oxide-doped zinc oxide (AZO), an indium-zinc oxide (IZO), or a gallium-doped zinc oxide (GZO). The second electrode formed of such transparent conductive materials has the work function value of, for example, 4.1 eV to 4.5 eV. Furthermore, in the imaging element and the like of the present disclosure including these preferable forms, the first electrode may have a form made of a transparent conductive material such as an indium-tin oxide (ITO), an indium-zinc oxide (IZO), or a tin oxide (SnO$_2$). The first electrode formed of such transparent conductive materials has the work function value of, for example, 4.8 eV to 5.0 eV.

Furthermore, in the case where the second electrode is formed of an In$_a$(Ga, Al)$_b$Zn$_c$O$_d$, the second electrode may have a layered structure of a second B-layer and a second A-layer from a side of the light receiving layer and the like, and a work function value of the second A-layer of the second electrode is lower than a work function value of the second B-layer of the second electrode. Additionally, in this case, it may be possible to have a constitution in which a difference between the work function value of the second A-layer of the second electrode and the work function value of the second B-layer of the second electrode is 0.1 eV to 0.2 eV, and furthermore, it may be possible to have a constitution in which the difference between the work function value of the first electrode and the work function value of the second A-layer of the second electrode is 0.4 eV or more. Alternatively, since the difference between the work function value of first electrode and the work function value of the second A-layer of the second electrode is set to 0.4 eV or more, it may be possible to have a constitution that generates an internal electric field in the light receiving layer and the like on the basis of the difference of the work function value and can improve internal quantum efficiency. Here, the work function values of the second A-layer and the second B-layer of the second electrode can be controlled by controlling an introduced amount of oxygen gas (oxygen gas partial pressure) at the time of formation on the basis of the sputtering method. Furthermore, it may be possible to have a constitution in which the second electrode has a thickness of $1\times10^{-8}$ m to $1.5\times10^{-7}$ m, and a ratio between a thickness of the second A-layer of the second electrode and a thickness of the second B-layer of the second electrode is 9/1 to 1/9.

Meanwhile, more preferably, the thickness of the second B-layer of the second electrode is thinner than the thickness of the second A-layer in order to reduce influence of an oxygen atom and an oxygen molecule to the light receiving layer and the like. Thus, the second electrode has the two-layer structure of the second A-layer and the second B-layer, and furthermore, the work function in the second electrode can be optimized by defining the difference between the work functions of the second B-layer and the second A-layer, and carrier exchange (movement) becomes easier.

Furthermore, in the imaging element and the like of the present disclosure including the above-described various kinds of preferable forms, the second electrode has a thickness of $1\times10^{-8}$ m to $1.5\times10^{-7}$ m, preferably, $2\times10^{-8}$ m to $1\times10^{-7}$ m.

Moreover, in the imaging element and the like of the present disclosure including the above-described various kinds of preferable forms, a refraction index of the second electrode and a refraction index of the second buffer layer are preferably 1.9 to 2.2. Furthermore, a difference between the refraction index of the second electrode and the refraction index of the second buffer layer is preferably 0.3 or less, thereby suppressing scattering of incident light and achieving improvement of incidence efficiency to the light receiving layer and the like.

Additionally, in the imaging element and the like of the present disclosure including the above-described various kinds of preferable forms, the second electrode preferably has surface roughnesses Ra of 1.5 nm or less and Rq of 2.5 nm or less. Meanwhile, the surface roughnesses Ra and Rq are based on provisions of JIS B0601:2013. Such smoothness of the second electrode suppresses surface scattering reflection at the second electrode and can reduce surface reflection of light entering the second electrode. Consequently, a light amount loss of light entering the light receiving layer and the like via the second electrode can be suppressed, and bright current characteristics at the time of photoelectric conversion can be improved.

Furthermore, in the imaging element and the like of the present disclosure including the above-described various kinds of preferable forms, the second electrode desirably has an electric resistance value of $1\times10^{-6}$ Ω·cm or less. Alternatively, the second electrode desirably has the sheet resistance value of $3\times10$ Ω/□ to $1\times10^3$ Ω/□.

Furthermore, in the imaging element and the like of the present disclosure including the above-described various kinds of preferable forms, internal compressive stress (compressive stress) of a layered structural object formed of the first buffer layer, second buffer layer, and second electrode is preferably 10 MPa to 80 MPa. Consequently, occurrence of stress damage on the light receiving layer and the like can be more surely suppressed at the time of forming the layered structural object.

Additionally, in the imaging element and the like of the present disclosure including the above-described various kinds of preferable forms, it may be possible to have a form in which transparency of the second buffer layer is controlled by controlling the oxygen gas partial pressure at the time of forming the second buffer layer on the basis of the sputtering method. The oxygen gas partial pressure is not limited, but 0.005 to 0.02 may be exemplified. The second buffer layer desirably has light transmissivity of 80% or more relative to light having a wavelength of 400 nm to 660 nm.

Furthermore, in the imaging element and the like of the present disclosure including the above-described various kinds of preferable forms, it may be possible to have a form in which $J_{d-5}/J_{d-0} \leq 2$ is satisfied in the case of defining a value of dark current flowing between the first electrode and the second electrodes as $J_{d-0}$ (amperes) at the time of applying 0 V between the first electrode and the second electrode, and defining a value of dark current flowing between the first electrode and the second electrode as $J_{d-5}$ (amperes) at the time of applying 5 V between the first electrode and the second electrode (at the time of applying reverse bias voltage of −5 V). Furthermore, it may be possible to have a form in which $J_d/J_{d-0} \leq 1.7$ is satisfied in the case of defining a value of dark current flowing between the first electrode and the second electrode as $J_d$ (amperes) at the time of applying voltage higher than 0 V and equal to or less than 5 V between the first electrode and the second electrode. Here, the dark current can be acquired by measuring current flowing between the first electrode and the second electrode at the time of applying reverse bias voltage between the first electrode and the second electrode in a state that light is not emitted, specifically, in a dark state.

Furthermore, in the imaging element and the like of the present disclosure including the above-described various kinds of preferable forms, the second electrode desirably has the light transmissivity of 75% or more relative to the light having the wavelength of 400 nm to 660 nm. Additionally, the first electrode desirably has light transmissivity of 75% or more relative to the light having the wavelength of 400 nm to 660 nm.

An optical sensor and an image sensor may be formed by the electronic device of the present disclosure. Furthermore, in this case, a light emitting/light receiving layer can be formed of, for example, an organic photoelectric conversion material.

In the imaging element and the like of the present disclosure, light receiving or light emitting/light receiving of light (electromagnetic waves, in a broad meaning, including visible light, ultra violet, and infrared) in the light receiving layer and the like is performed via the second electrode.

As described above, in the imaging element and the like of the present disclosure, the work function value of the second electrode can be controlled by controlling the introduced amount of oxygen gas (oxygen gas partial pressure) at the time of forming the second electrode on the basis of the sputtering method. Furthermore, the work function values of the second A-layer and the second B-layer of the second electrode can be controlled by controlling the introduced amount of oxygen gas (oxygen gas partial pressure) at the time of forming the second electrode on the basis of the sputtering method. Moreover, in the imaging element and the like of the present disclosure, it may be possible to have a form in which an oxygen content rate is less than an oxygen content rate of a stoichiometric composition in the second electrode. Here, the work function value of the second electrode can be controlled on the basis of the oxygen content rate, and the smaller than the oxygen content rate of the stoichiometric composition the oxygen content rate becomes, in other words, the larger oxygen deficiency becomes, the smaller the work function value becomes. Meanwhile, the oxygen content rate of the second A-layer of the second electrode is lower than the oxygen content rate of the second B-layer of the second electrode.

The first buffer layer, second buffer layer, and second electrode are formed on the basis of the sputtering method, and specifically, a magnetron sputtering method and a parallel plate sputtering method may be exemplified, and a plasma generation forming method using a DC discharge method and an RF discharge method may be exemplified.

As a method of forming the first electrode, it may be possible to exemplify: PVD methods such as a vacuum deposition method, a reactive deposition method, various kinds of sputtering methods, an electron-beam deposition method, and an ion plating method; various kinds of CVD methods including a pyrosol process, a method of pyrolyzing an organometallic compound, a spray method, a dip method, and an MOCVD method; an electroless plating method; and an electroplating method although depending on a material constituting the first electrode.

In the electronic device of the present disclosure including the above-described various kinds of preferable forms and constitutions, specifically, it maybe possible to have a constitution in which the first electrode is formed on a substrate, the light receiving layer and the like are formed on the first electrode, and the second electrode is formed on the light receiving layer and the like, for example. In other words, the electronic device of the present disclosure has a two-terminal electronic device structure including the first electrode and the second electrode. However, not limited thereto, it may be possible to have a three-terminal electronic device structure further including a control electrode, and flowing current can be modulated by applying voltage to the control electrode. As such a three-terminal electronic device structure, specifically, a constitution and a structure same as a field effect transistor (FET) of a so-called bottom gate/bottom contact type, bottom gate/top contact type, top gate/bottom contact type, top gate/top contact type may be exemplified. Meanwhile, while the second electrode can be made to function as a cathode electrode (negative electrode) (namely, function as an electrode to extract electrons), the first electrode can be made to function as an anode electrode (positive electrode) (namely, function as an electrode to extract positive holes). It may be possible to adopt a structure in which a plurality of imaging elements or electronic devices each having a light receiving layer and the like including a different optical absorption spectrum. Furthermore, for example, it may be possible to adopt a structure in which a substrate is formed of a silicon semiconductor substrate, a drive circuit of an imaging element or an electronic device and a light receiving layer and the like are provided on this silicon semiconductor substrate, and the imaging element and the electronic device are layered on the silicon semiconductor substrate.

The light receiving layer and the like may be an amorphous state or may also be a crystalline state. As an organic material constituting the light receiving layer and the like (organic photoelectric conversion materials), it may be possible to exemplify an organic semiconductor material, an organic metal compound, and an organic semiconductor fine particle. Alternatively, as an material constituting the light receiving layer and the like, it may also be possible to exemplify a metal oxide semiconductor, an inorganic semiconductor particle, a material having a core member covered with a shell member, and an organic-inorganic hybrid compound.

Here, as the organic semiconductor material, specifically, it may be possible to exemplify: an organic pigment represented by quinacridone and a derivative thereof; a pigment obtained by chelating, by an organic material, an ion in the early period (indicating a metal on the left side of the periodic table) represented by Alq3[tris(8-quinolinolato)aluminum(III)]; an organic metal pigment having a complex formed with a transition metal ion and an organic material represented by phthalocyanine zinc (II); dinaphthothienothiophene (DNTT); and the like.

Furthermore, as the organic metal compounds, specifically, it may be possible to exemplify the above-described pigment obtained by chelating an ion in the early period by an organic material, and the organic metal pigment having a complex formed by a transition metal ion and an organic material. As the organic semiconductor fine particles, specifically, it may be possible to exemplify: an aggregate of the above-described organic pigment represented by quinacridone and a derivative thereof; an aggregate of the pigment obtained by chelating an ion in the early period by an organic material; an aggregate of the organic metal pigment having a complex formed by a transition metal ion and an organic material; Prussian blue having a metal ion crosslinked with a cyano group, and a derivative thereof; or mixtures of these aggregates.

As the metal oxide semiconductor or the inorganic semiconductor fine particle, specifically, it may be possible to exemplify ITO, IGZO, ZnO, IZO, $IrO_2$, $TiO_2$, $SnO_2$, $SiO_X$, and a metal chalcogen semiconductor including chalcogen [for example, sulfur (S), selenium (Se) and tellurium (Te)] (specifically, CdS, CdSe, ZnS, CdSe/CdS, CdSe/ZnS, PbSe), ZnO, CdTe, GaAs, and Si.

As the material having a core covered with a shell member, namely, as a combination of (core member and shell member), it may be possible to exemplify an organic material such as (polystyrene and polyaniline) and a metal material such as (a metal material that is hardly ionized and a metal material that is easily ionized). As the organic-inorganic hybrid compound, Prussian blue having a metal ion crosslinked with a cyano group, and a derivative thereof may be exemplified. Besides that, it may be possible to exemplify a coordination polymer that is a generic term indicating those having a metal ion infinitely crosslinked with bipyridines and those having a metal ion crosslinked with a polyvalent ionic acid represented by an oxalic acid and a rubeanic acid.

As the method of forming the light receiving layer and the like, it may be possible to exemplify: a coating method; a physical vapor deposition method (PVD method); and various kinds of chemical vapor deposition methods (CVD method) including the MOCVD method although depending on a material to be used. Here, as the coating methods, specifically, it may be possible to exemplify: a spin coating method; an immersion method; a casting method; various kinds of printing methods such as a screen printing method, an inkjet printing method, an offset printing method, and a gravure printing method; a stamping method; a spray method; and other various kinds of coating methods including an air doctor coater method, a blade coater method, a rod coater method, a knife coater method, a squeeze coater method, a reverse roll coater method, a transfer roll coater method, a gravure coater method, a kiss coater method, a cast coater method, a spray coater method, a slit orifice coater method, and a calender coater method. Meanwhile, as a solvent used in the coating method, it may be possible to exemplify a non-polar or less polar organic solvent such as toluene, chloroform, hexane, and ethanol. Additionally, as the PVD method, it may be possible to exemplify: various kinds of vacuum deposition methods such as an electron beam heating method, a resistance heating method, and a flash deposition; a plasma deposition method; various kinds of sputtering methods such as a bipolar sputtering method, a direct current sputtering method, a direct current magnetron sputtering method, a high-frequency sputtering method, a magnetron sputtering method, an ion beam sputtering method, and a bias sputtering method; and various kinds of ion plating methods such as a direct current (DC) method, an RF method, a multi-cathode method, an activated reaction method, an electric field deposition method, a high-frequency ion plating method, and a reactive ion plating method.

The thickness of the light receiving layer and the like is not limited, but it may be possible to exemplify $1\times10^{-10}$ m to $5\times10^{-7}$ m, for example.

As the substrate, it may be possible to exemplify organic polymers (having a form of a high polymer material such as a plastic film, a plastic sheet, and a plastic substrate formed of high polymer materials and having flexibility) such as polymethyl methacrylate (polymethyl methacrylate, PMMA), polyvinyl alcohol (PVA), polyvinyl phenol (PVP), polyether sulfone (PES), polyimide, polycarbonate (PC), polyethylene terephthalate (PET), and polyethylene naphthalate (PEN). Use of the substrate formed of such a polymeric material having flexibility enables, for example, incorporation or integration to an electronic device having a curved surface shape. Alternatively, as the substrate, it may be possible to exemplify: various kinds of glass substrates; various kinds of glass substrates each having a surface formed with an insulation film; a quartz substrate; a quartz substrate having a surface formed with an insulation film; a silicon semiconductor substrate; a silicon semiconductor substrate having a surface formed with an insulation film; and a metal substrate made of various kinds of alloys such as stainless steel and various kinds of metals. Meanwhile, as the insulation film, it maybe possible to exemplify: a silicon oxide-based material (e.g., SiO, and spin-on glass (SOG)); a silicon nitride ($SiN_Y$); a silicon oxide nitride (SiON); an aluminum oxide ($Al_2O_3$); a metal oxide; and a metal salt. Alternatively, a conductive substrate having a surface formed with the above-described insulation film (substrate made of a metal such as gold or aluminum, and a substrate made of highly-oriented graphite) may also be used. The surface of the substrate is desirably smooth, but may have a roughness that does not exert adverse effects on the characteristics of the light receiving layer and the like. Adhesiveness between the first electrode and the substrate may be enhanced by forming a silanol derivative by a silane coupling method, forming a thin film made of a thiol derivative, a carboxylic acid derivative, a phosphoric acid derivative or the like by a SAM method or the like, or forming a thin film made of an insulating metal salt or a metal complex by the CVD method and the like on the surface of the substrate.

As the case may be, the second electrode and the first electrode may be covered with cover layers. As a material constituting the cover layer, it maybe possible to exemplify: a silicon oxide-based material; a silicon nitride ($SiN_Y$); not only an inorganic insulating material such as highly dielectric insulation films of a metal oxide such as aluminum oxide ($Al_2O_3$) but also polymethyl methacrylate (PMMA); polyvinyl phenol (PVP); polyvinyl alcohol (PVA); a polyimide; a polycarbonate (PC); polyethylene terephthalate (PET); polystyrene; silanol derivatives (silane-coupling agents) such as N-2 (aminoethyl) 3-amino propyltrimethoxysilane (AEAPTMS), 3-mercaptopropyltrimethoxysilane (MPTMS), and octadecyltrichlorosilane (OTS); and an organic insulating material (organic polymer) such as a straight-chain hydrocarbon having a functional group that can bind a control electrode to one end of octadecanethiol, dodecyl isocyanate, and the like, and also it may be possible to use combination thereof. Meanwhile, as the silicon oxide-based material, it maybe possible to exemplify silicon oxide ($SiO_x$), BPSG, PSG, BSG, AsSG, PbSG, silicon oxide nitride (SiON), SOG (spin-on glass), and a low-dielectric constant material (e.g., polyarylether, cyclo perfluorocarbon polymer and benzocyclobutene, cyclic fluoroplastic, polytetrafluoroethylene, arylether fluoride, polyimide fluoride, amorphous carbon, and organic SOG). As a forming method of the insulation layer, it may be possible to exemplify any one of: the above-described various kinds of PVD methods; various kinds of the CVD methods; the spin coating method; the above-described various kinds of coating methods; a sol-gel method; an electrodeposition method; a shadow mask method; and the spray method.

EXAMPLE 1

Figure 1B:
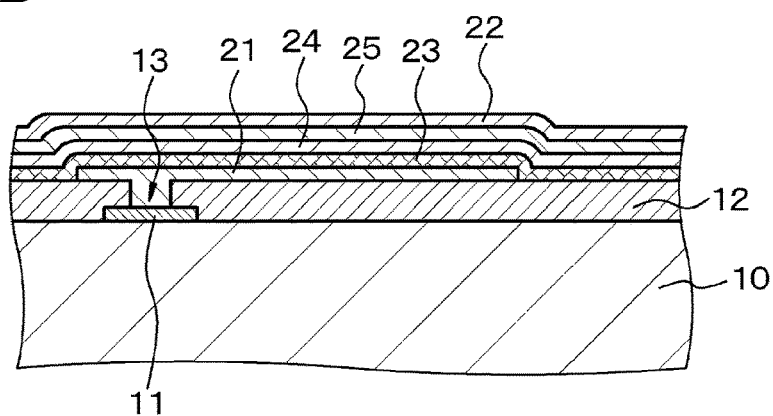

Example 1 relates to an imaging element of the present disclosure and an electronic device of the present disclosure. FIG. 1B illustrates a schematic partial cross-sectional view of the imaging element or the electronic device of Example 1.

The imaging element of Example 1 or Example 2 described later includes a layered structural body 20 including: a first electrode 21; a light receiving layer formed on the first electrode 21; and a second electrode 22 formed on the light receiving layer. Alternatively, the electronic device of Example 1 or Example 2 described later includes: a light emitting/light receiving layer; a first electrode 21 electrically connected to the light emitting/light receiving layer; and a second electrode 22 made of a transparent conductive material formed on the light emitting/light receiving layer. Meanwhile, in the following description, the light receiving layer and the light emitting/light receiving layer will be collectively referred to as "light receiving layer and the like 23". Additionally, a single first buffer layer 24 formed of an amorphous organic material and a single second buffer layer 25 formed of an amorphous inorganic material are provided between the light receiving layer and the like 23 and the second electrode 22 from a side of the light receiving layer and the like 23.

The second buffer layer 25 is formed of a metal oxide or an oxide semiconductor, specifically, at least two kinds of materials selected from a group of a zinc oxide, a silicon oxide, a tin oxide, a niobium oxide, a titanium oxide, a molybdenum oxide, an aluminum oxide, an indium-doped gallium zinc oxide (IGZO), a magnesium oxide, and a hafnium oxide. More specifically, in Example 1, the second buffer layer 25 is formed of a zinc oxide and an aluminum oxide (e.g., 0.1 mass % to 2 mass %) and a magnesium oxide (e.g., 1 mass % to 25 mass %), ora zinc oxide and an aluminum oxide (e.g., 0.1 mass % to 2 mass %) and a silicon oxide (e.g., 1 mass % to 25 mass %). Following Table 1 shows concrete compositions of the second buffer layer 25. Furthermore, a thickness of the second buffer layer 25 is set to $3 \times 10^{-9}$ m to $3 \times 10^{-7}$ m, specifically, 5 nm. Furthermore, a sheet resistance value of the second buffer layer 25 is $1 \times 10^5$ Ω/□ or more, specifically, a sheet resistance value of the second buffer layer 25 of Example 1A is $5 \times 10^5$ Ω/□, and a sheet resistance value of the second buffer layer 25 of Example 1B is $7 \times 10^5$ Ω/□. Additionally, a refraction index of the second electrode 22 is 2.1, a refraction index of the second buffer layer 25 of Example 1A is 2.0, and a refraction index of the second buffer layer 25 of Example 1B is 1.9. In other words, a real number part of the refraction index of the second buffer layer 25 is 1.9 to 2.2, and a difference between the refraction index of the second electrode 22 and the refraction index of the second buffer layer 25 is 0.3 or less.

TABLE 1

|  | Material A (Example 1A) | Material B (Example 1B) |
| --- | --- | --- |
| Principal Component | ZnO | ZnO |
| Accessory Components | $Al_2O_3$ (5 mass %) and $SiO_2$ (1 mass %) | $Al_2O_3$ (10 mass %) and MgO (25 mass %) |

Additionally, various kinds of Comparative Examples described below have constitutions as follows.

COMPARATIVE EXAMPLE 1A

The second buffer layers in the imaging element and the electronic device of Example 1 are not formed, and additionally a second electrode is formed of ITO. In other words, provided is a structure in which a first electrode, a light receiving layer and the like, an NBphen layer, the second electrode (formed of ITO) are layered.

COMPARATIVE EXAMPLE 1B

The second buffer layers in the imaging element and the electronic device of Example 1B are not formed. In other words, provided is a structure in which a first electrode, a light receiving layer and the like, a first buffer layer, and a second electrode are layered.

COMPARATIVE EXAMPLE 1C

The first buffer layers and the second buffer layers in the imaging element and the electronic device of Example 1 are not formed, and additionally, a second electrode is formed of ITO. In other words, provided is a structure in which a first electrode, a light receiving layer and the like, and the second electrode are layered.

Figure 13:
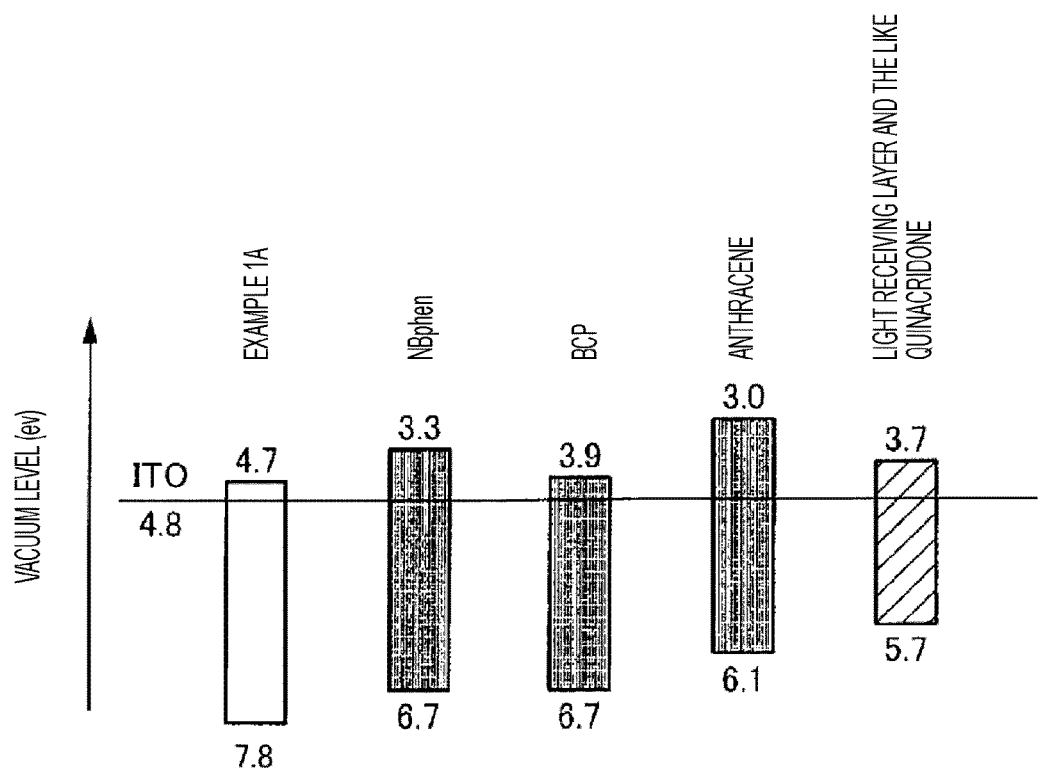
FIG. 13 is a diagram illustrating vacuum levels of various kinds of materials.

In Example 1, the first buffer layer 24 is formed of NBphen<2, 9-bis(naphthalen-2-yl)-4, 7-diphenyl-1,10-phenanthroline> that is a derivative of phenanthroline. The first buffer layer 24 has a thickness of $3 \times 10^{-9}$ m to $3 \times 10^{-7}$ m, specifically, 5 nm. NBphen constituting the first buffer layer 24 has an energy barrier of 0.2 eV or less between the first buffer layer 24 and the light receiving layer and the like 23, and also this is a material in which an energy barrier between the first buffer layer 24 and the second buffer layer 25 is 0.2 eV or less. FIG. 13 illustrates vacuum levels of: the material A; three kinds of materials constituting the first buffer layer; and a material of the light receiving layer and the like. As for Example 1A (material A), an energy level is high compared to organic materials, and a difference (ΔE) from a HOMO value of the light receiving layer and the like is also 2 eV or more.

The second electrode 22 is formed of an amorphous oxide that is transparent and has conductivity. Specifically, the second electrode 22 is formed of a material obtained by adding or doping at least one kind of material selected from a group consisting of aluminum, gallium, tin, and indium to one kind of material selected from a group consisting of an indium oxide, a tin oxide, and a zinc oxide.

Alternatively, the second electrode 22 is formed of $In_a(Ga, Al)_bZn_cO_d$. In other words, the second electrode 22 is formed of an amorphous oxide including at least a four-element based compound $[In_a(Ga, Al)_bZn_cO_d]$ of indium (In), gallium (Ga) and/or aluminum (Al), zinc (Zn), and oxygen (O). "a", "b", "c", "d" may have various kinds of values. It may be possible to exemplify 0.5 to 1 as a value of "a", 0.5 to 1 as a value of "b", 0.5 to 1 as a value of "c", and 4 to 7 as a value "d", but not limited thereto.

Here, in the imaging element and the electronic device of Example 1, more specifically, the first electrode 21 is formed on a substrate 10 formed of a silicon semiconductor substrate, the light receiving layer and the like 23 is formed on the first electrode 21, and the first buffer layer 24, second buffer layer 25, and second electrode 22 are formed on the light receiving layer and the like 23 in this order. In other words, the imaging element and the electronic device in Example 1 or Example 2 described later has a two-terminal electronic device structure including the first electrode 21 and the second electrode 22. In the light receiving layer and the like 23, specifically, photoelectric conversion is performed. Furthermore, in the imaging element and the electronic device in Example 1 or Example 2 described later, a difference between a work function value of the second electrode 22 and a work function value of the first electrode 21 is 0.4 eV or more. Here, since the difference between the work function value of the second electrode 22 and the work function value of the first electrode 21 is set to 0.4 eV or more, an internal electric field is generated in the light receiving layer and the like 23 on the basis of the difference of the work function value, and internal quantum efficiency can be improved. The second electrode 22 functions as a cathode electrode (negative electrode). In other words, the second electrode 22 functions as an electrode to extract electrons. On the other hand, the first electrode 21 functions as an anode electrode (positive electrode). In other words, the first electrode 21 functions as an electrode to extract positive holes. The light receiving layer and the like 23 are formed of an organic photoelectric conversion material, specifically, quinacridone having a thickness of 0.1 μm, for example.

Furthermore, the second electrode 22 has the work function of 4.5 eV or less, specifically, 4.1 eV to 4.5 eV. More specifically, in Example 1, the second electrode 22 is formed of a transparent conductive material such as an amorphous indium-zinc oxide (IZO) or an amorphous indium-doped gallium zinc oxide (IGZO). Furthermore, the first electrode 21 is formed of a transparent conductive material such as an indium-tin oxide (ITO). Here, a work function of IZO or IGZO is 4.1 eV to 4.3 eV although depending on film forming conditions. Furthermore, a work function of ITO is 4.8 eV to 5.0 eV although depending on film forming conditions. As other materials constituting the second electrode 22, it may be possible to exemplify a transparent conductive material such as an aluminum oxide-doped zinc oxide (AZO), an indium-gallium oxide (IGO), or a gallium-doped zinc oxide (GZO). As other materials constituting the first electrode 21, it may be possible to exemplify a transparent conductive material such as an indium-zinc oxide (IZO) and a tin oxide ($SnO_2$) formed under the film forming conditions different from the second electrode 22. Meanwhile, the above description is almost similar in Example 2 described below. In Example 1, specifically, the second electrode 22 is formed of IZO.

Additionally, in the imaging element and the electronic device of Example 1 or Example 2 described later, the second electrode 22 has light transmissivity of 75% or more relative to light having a wavelength 400 nm to 660 nm, and the first electrode 21 also has light transmissivity of 75% or more relative to the light having the wavelength of 400 nm to 660 nm. The light transmissivity of the second electrode 22 and first electrode 21 can be measured by performing film formation of the second electrode 22 and the first electrode 21 on a transparent glass plate. Furthermore, the second electrode 22 has an electric resistance value of $1\times10^{-6}$ Ω·cm or less, and the second electrode 22 has a sheet resistance value of $3\times10$ Ω/□ to $1\times10^3$ Ω/□. The second electrode 22 has a thickness of $1\times10^{-8}$ m to $1.5\times10^{-7}$ m, preferably, $2\times10^{-8}$ m to $1\times10^{-7}$ m. Furthermore, the second electrode 22 has surface roughnesses Ra of 1.5 nm or less, and Rq of 2.5 nm or less. More specifically, the second electrode 22 formed of IZO having a thickness of 100 μm has the electric resistance value $6\times10^{-6}$ Ω·cm and the sheet resistance value of 60 Ω/□. Additionally, the second electrode 22 formed of a IGZO having a thickness of 100 μm has the electric resistance value of $2\times10^{-5}$ Ω·cm and the sheet resistance value of $2\times10^2$ Ω/□.

In the following, a manufacturing method of the imaging element and the electronic device of Example 1 will be described with reference to FIGS. 1A and 1B.

[Step-100]

The substrate 10 formed of a silicon semiconductor substrate is prepared. Here, the substrate 10 is provided with: drive circuits of the imaging element and the electronic device; a light receiving layer and the like (these are not illustrated); and a wire 11, and an insulation layer 12 is formed on a surface thereof. The insulation layer 12 is provided with an opened potion 13 having a bottom portion where the wire 11 is exposed. Further, the first electrode 21 made of ITO is formed (film formation) on the insulation layer 12 including the inside of the opened potion 13 on the basis of a sputtering method (refer to FIG. 1A).

[Step-110]

Next, after patterning is performed for the first electrode 21, the light receiving layer and the like 23 made of quinacridone are formed (film formation) on an entire surface by the vacuum deposition method. Furthermore, a single first buffer layer 24 made of an amorphous organic material and a single second buffer layer 25 made of an amorphous inorganic material are formed on the light receiving layer and the like 23 on the basis of the sputtering method, and additionally, the second electrode 22 made of IZO or IGZO is formed (film formation) on the basis of the sputtering method. Thus, the imaging element and the electronic device of Example 1 having a structure illustrated in FIG. 1B can be obtained.

Figure 2:
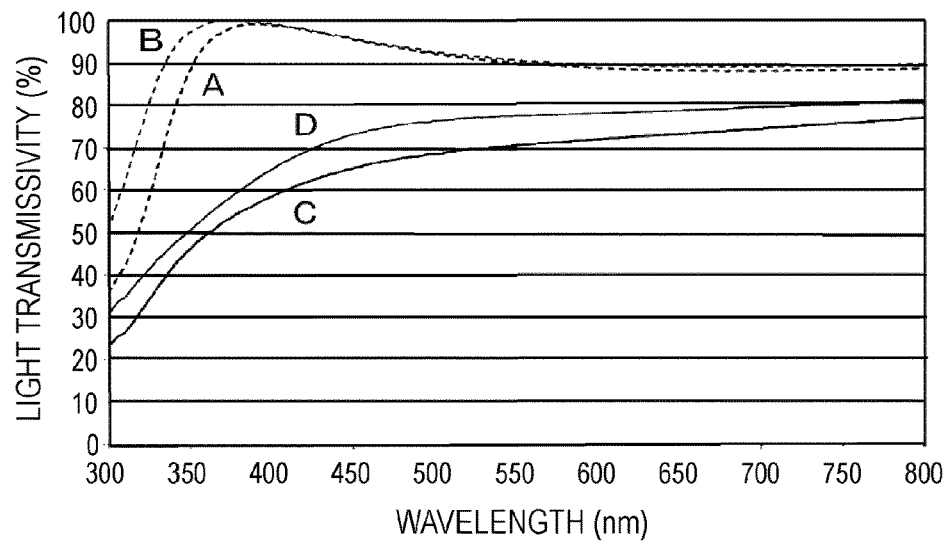
FIG. 2 is a graph illustrating an exemplary result of acquiring a relation between an introduced amount of oxygen gas (oxygen gas partial pressure) and a value of light transmissivity of the second buffer layer at the time of forming a second buffer layer on the basis of a sputtering method in Example 1.

Here, a value of the light transmissivity of the second buffer layer 25 is controlled by controlling an introduced amount of oxygen gas <oxygen gas partial pressure=($O_2$ gas pressure)/(total pressure of Ar gas and $O_2$ gas)> at the time of forming the second buffer layer 25 on the basis of the sputtering method. FIG. 2 illustrates a result of measuring a relation between the oxygen gas partial pressure and the light transmissivity of the second buffer layer 25 having a thickness of 0.1 μm. In FIG. 2, "A" represents data in the case of forming the second buffer layer 25 from the material A shown in Table 1 and setting the oxygen gas partial pressure to 0.02, "B" is data in the case of forming the second buffer layer 25 from the material B shown in Table 1 and setting the oxygen gas partial pressure to 0.02, "C" is data in the case of forming the second buffer layer 25 from the material A and setting the oxygen gas partial pressure 0.00, and "D" is data in the case of forming the second buffer layer 25 from the material B and setting the oxygen gas partial pressure to 0.00. A parallel plate sputtering device or a DC magnetron sputtering device was used as the sputtering device, and argon (Ar) gas was used as process gas.

It can be grasped from FIG. 2 that the second buffer layer 25 having high transparency can be formed by forming the second buffer layer 25 by the sputtering method in presence of oxygen gas. In other words, transparency of the second buffer layer 25 is controlled by controlling the oxygen gas partial pressure at the time of forming the second buffer layer 25 on the basis of the sputtering method.

Figure 3:
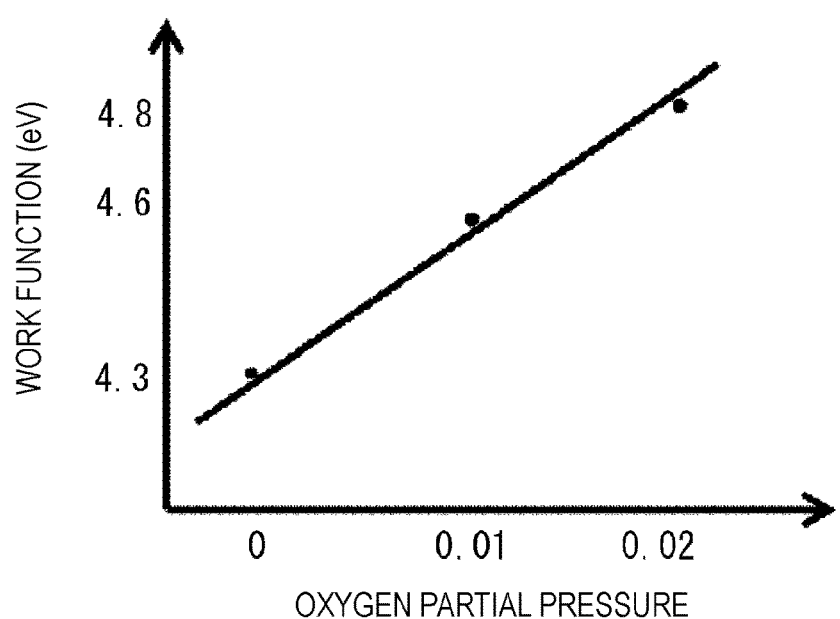
FIG. 3 is a graph illustrating an exemplary result of acquiring a relation between an introduced amount of oxygen gas (oxygen gas partial pressure) and a work function value of the second electrode at the time of forming a second electrode on the basis of the sputtering method in Example 1.

Furthermore, the work function value of the second electrode 22 is controlled by controlling an introduced amount of the oxygen gas <oxygen gas partial pressure=($O_2$ gas pressure)/(total pressure of Ar gas and $O_2$ gas)> at the time of forming the second electrode 22 on the basis of the sputtering method. A graph of FIG. 3 illustrates an exemplary result of acquiring a relation between the oxygen gas partial pressure and a work function value of the second electrode 22 made of IGZO, in which the higher the value of the oxygen gas partial pressure becomes, namely, the smaller oxygen deficiency becomes, the larger the work function value of the second electrode 22 becomes, and the lower the value of the oxygen gas partial pressure becomes, namely, the larger the oxygen deficiency becomes, the smaller the work function value of the second electrode 22 becomes. The parallel plate sputtering device or the DC magnetron sputtering device was used as the sputtering device, argon (Ar) gas was used as the process gas, and an $InGaZnO_4$ sintered body is used as a target. The relation between the oxygen gas partial pressure and the work function value of the second electrode 22 made of IZO was also similar to the relation between the oxygen gas partial pressure and the work function value of the second electrode 22 made of IGZO.

Thus, in the imaging element and the electronic device of Example 1, the work function value of the second electrode 22 is controlled by controlling the introduced amount of oxygen gas (oxygen gas partial pressure) at the time of forming the second electrode 22 on the basis of the sputtering method. In the second electrode 22, an oxygen content rate is smaller than an oxygen content rate of a stoichiometric composition.

Figure 4:
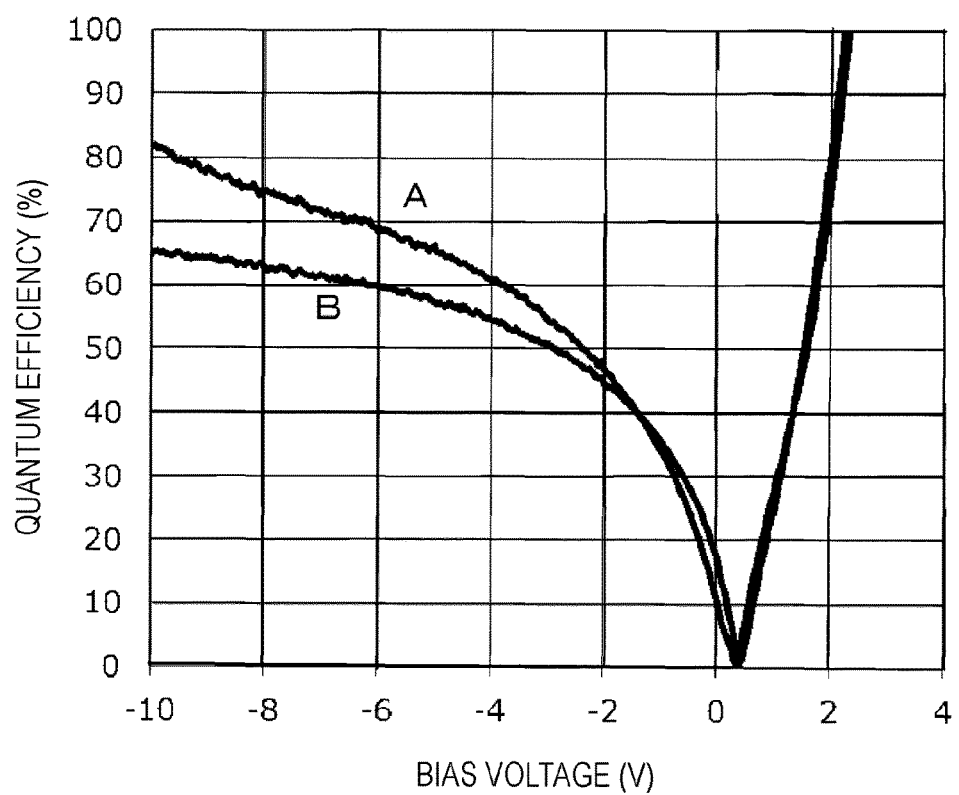
FIG. 4 is a graph acquiring a relation between bias voltage and quantum efficiency obtained in imaging elements and electronic devices of Example 1B and Comparative Example 1A.

FIG. 4 illustrates a result of acquiring a relation between reverse bias voltage and quantum efficiency obtained in the imaging element and the electronic device (photoelectric converting element) of Example 1B and the imaging element and the electronic device (photoelectric converting element) of Comparative Example 1A. In FIG. 4, "A" represents a measurement result of the imaging element and the electronic device in Example 1B (the second buffer layer 25 is formed of the material B), and "B" represents a measurement result of the imaging element and the electronic device in Comparative Example 1A. It can be grasped from FIG. 4 that the imaging element and the electronic device in Example 1B have the quantum efficiency higher than that of the imaging element and the electronic device in Comparative Example 1A.

Figure 5:
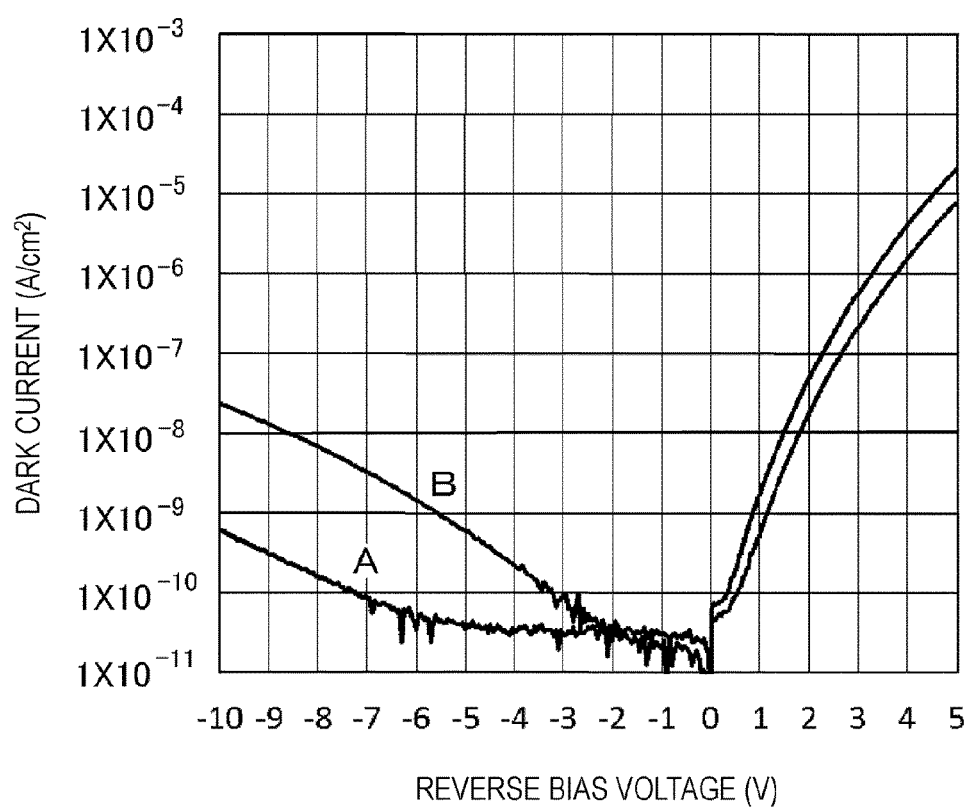
FIG. 5 illustrates measurement results of dark current obtained in the imaging elements and the electronic devices of Example 1B and Comparative Example 1B.
Figure 6:
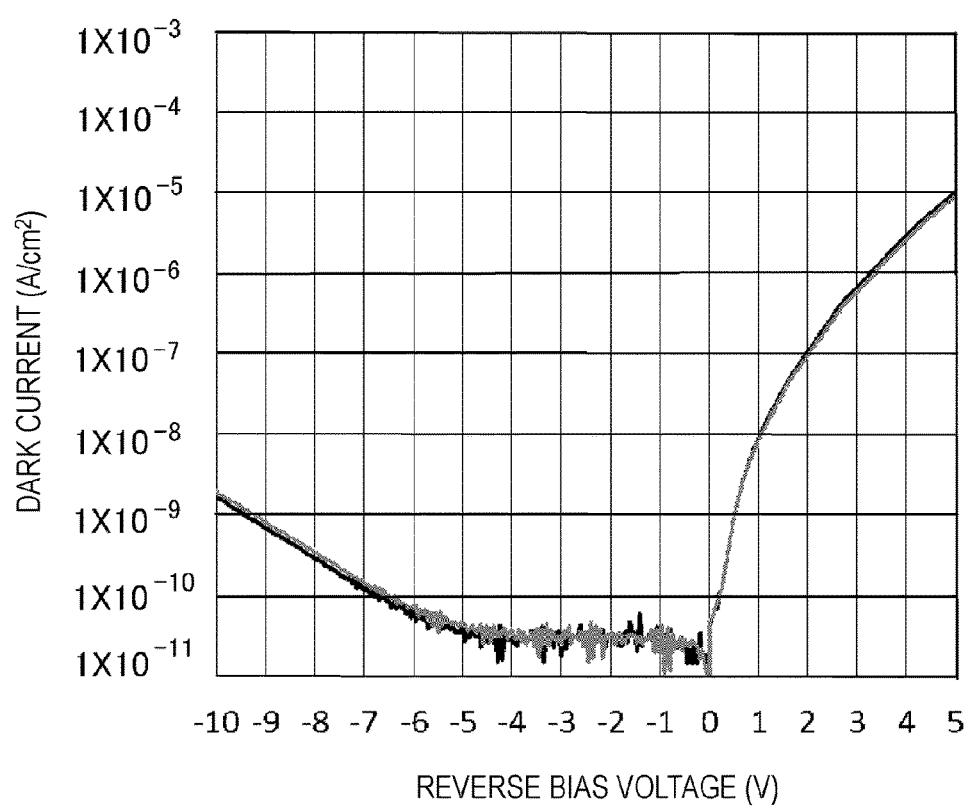
FIG. 6 illustrates a measurement result of dark current obtained in the imaging element and the electronic device of Comparative Example 1A.

Additionally, FIGS. 5 and 6 illustrate results of acquiring a relation between reverse bias voltage and dark current obtained in the imaging element and the electronic device (photoelectric converting element) in Example 1B and the imaging elements and the electronic devices (photoelectric converting elements) in Comparative Example 1A and Comparative Example 1B. In FIG. 5, "A" represents a measurement result of the imaging element and the electronic device in Example 1B (the second buffer layer 25 is formed of the material B), and "B" represents a measurement result of the imaging element and the electronic device in Comparative Example 1B. Furthermore, FIG. 6 is a measurement result of the imaging element and the electronic device in Comparative Example 1A. It can be grasped from FIGS. 5 and 6 that generation of dark current is more suppressed in the imaging element and the electronic device of Example 1B than in the imaging elements and the electronic devices of Comparative Example 1A and Comparative Example 1B.

Dark Current Value at Reverse Bias Voltage 10 V
Example 1B $6 \times 10^{-10}$ amps/$cm^2$
Comparative Example 1A $2 \times 10^{-9}$ amps/$cm^2$
Comparative Example 1B $2 \times 10^{-8}$ amps/$cm^2$ According to FIG. 5, in the imaging element and the electronic device of Example 1, $J_{d-5}/J_{d-0} \leq 2$ is satisfied in the case of defining a value of dark current flowing between the first electrode 21 and the second electrode 22 to $J_{d-0}$ (amperes) at the time of applying 0 V between the first electrode 21 and the second electrode 22, and defining a value of dark current flowing between the first electrode 21 and the second electrode 22 to $J_{d-5}$ (amperes) at the time of applying reverse bias voltage of five bolts (at the time applying −5 V) between the first electrode 21 and the second electrode 22. Furthermore, $J_d/J_{d-0} \leq 1.7$ is satisfied in the case of defining a value of dark current flowing between the first electrode 21 and the second electrode 22 to $J_d$ (amperes) at the time of applying voltage higher than 0 V and equal to 5 V or less between the first electrode 21 and the second electrode 22.

Additionally, values of the internal quantum efficiency in the imaging elements and the electronic devices in Example 1B and Comparative Example 1A were as shown in Table 2 below. An internal quantum efficiency η represents a ratio of the number of electrons generated relative to the number of incident photons, and can be expressed by a following formula.

$$\eta = \{h \cdot c/(q \cdot \lambda)\}(I/P) = (1.24/\lambda)(I/P)$$

Here, reference signs represent as follows.
h: Planck constant
c: Light speed
q: Charge of electrons
λ: Incident light wavelength (μm)
I: Current value (amps/$cm^2$) of bright current, and obtained at reverse bias voltage 1 V in measurement of Example 1
P: Incident light power (amps/$cm^2$)

Additionally, Table 3 shows measurement results of surface roughnesses Ra and Rq of the second electrode 22 and measurement results of light transmissivity in Example 1B and Comparative Example 1A.

TABLE 2

|  | Internal Quantum Efficiency (%) at Reverse Bias Voltage 10 V |
| --- | --- |
| Example 1B | 80 |
| Comparative Example 1A | 68 |

TABLE 3

|  | Example 1B | Comparative Example 1A |
| --- | --- | --- |
| Ra | 0.36 nm | 2.5 nm |
| Rq | 0.46 nm | 3.6 nm |
| Light transmissivity at wavelength 450 nm | 93% | 78% |
| Light transmissivity at wavelength 550 nm | 88% | 84% |

Figure 7A:
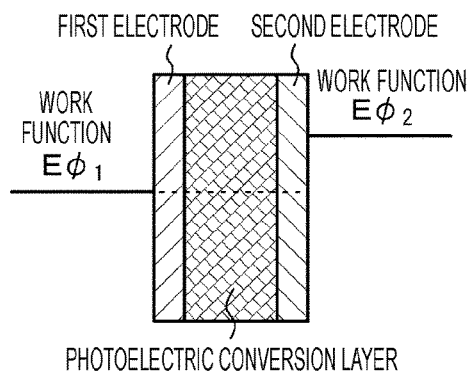
FIGS. 7A and 7B are conceptual diagrams of energy diagrams in the imaging elements and the electronic devices of Example 1B and Comparative Example 1C respectively.
Figure 7B:
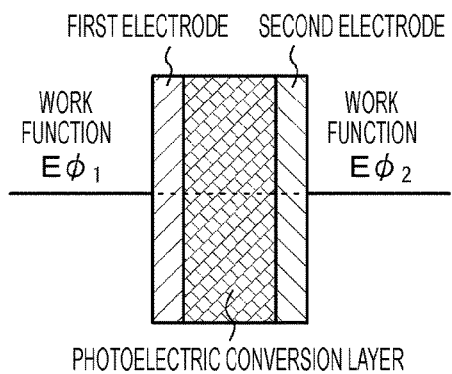
Figure 7C:
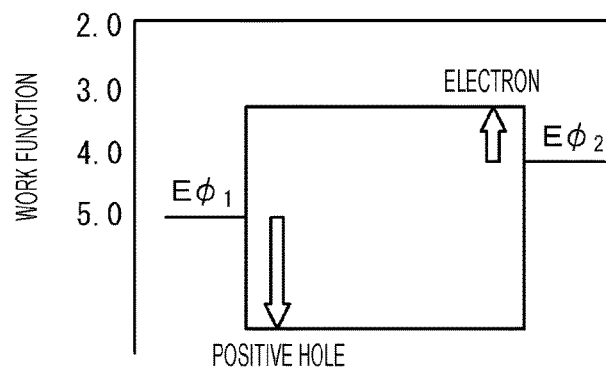
FIGS. 7C and 7D are conceptual diagrams respectively illustrating correlation between a difference of work function value and the energy diagram in the imaging elements and the electronic devices of Example 1B and Comparative Example 1C.
Figure 7D:
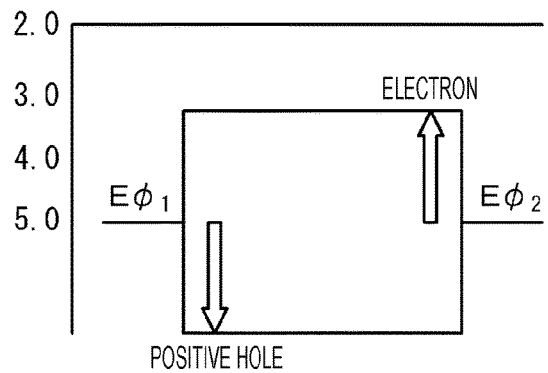

By the way, in the imaging element and the electronic device of Comparative Example 1C, since both the second electrode and the first electrode are formed of ITO, there is no difference between the work function value of the first electrode and the work function value of the second electrode as illustrated in a conceptual diagram of an energy diagram of FIG. 7B. Therefore, positive holes easily flow from the first electrode to the second electrode, and as a result thereof, dark current is increased. Furthermore, since there is no difference between the work function value of the first electrode and the work function value of the second electrode, there is no potential gradient (in other words, no internal electric field is generated in the light receiving layer and the like) at the time of extracting electrons and positive holes, and it may be difficult to smoothly extract the electrons and positive holes (refer to a conceptual diagram of FIG. 7D). On the other hand, in the imaging element and the electronic device of Example 1B, the second electrode is formed of IZO and the first electrode is formed of ITO, and the difference between the work function value of the first electrode and the work function value of the second electrode is 0.4 eV or more. FIG. 7A illustrates a conceptual diagram of an energy diagram. Meanwhile, illustration of the first buffer layer and the second buffer layer is omitted in FIG. 7A. Therefore, the positive holes from the first electrode can be prevented from flowing into the second electrode, and as a result, generation of dark current is suppressed. Furthermore, since the difference between the work function value of the first electrode and the work function value of the second electrode is 0.4 eV or more, a potential gradient is generated (in other words, an internal electric field is generated in the light receiving layer and the like) at the time of extracting the electrons and positive holes, and the electrons and positive holes can be smoothly extracted using this potential gradient (refer to a conceptual diagram in FIG. 7C).

Measurement results of internal compressive stress in the layered structural object formed of the first buffer layer 24 having a thickness of 20 nm, the second buffer layer 25 formed of the material B and having a thickness of 20 nm, and the second electrode 22 formed of IZO and having a thickness of 50 nm are shown as Example 1C in Table 4 below. Additionally, measurement results of internal compressive stress of a crystalline ZnO having a thickness of 50 nm are shown as Comparative Example 1D in Table 4 below. The internal compressive stress was measured by using a commercially available thin film stress measurement device on the basis of a known method. Furthermore, respective samples from the layered structural object and the like formed by film formation on a silicon wafer and subjected to stress measurement were immersed in acetone for 30 seconds, and then a state of an insulation layer was observed by using an optical microscope (5-fold magnification). As a result, in Example 1C, there was no change between before and after immersion, but in Comparative Example 1D, partial separation was found between the silicon wafer and the ZnO film. Thus, it can be grasped that formation of the first buffer layer 24 and the second buffer layer 25 can surely suppress occurrence of stress damage on the light receiving layer and the like at the time of forming the second electrode 22. Furthermore, according to the above results, the internal compressive stress (compressive stress) of the layered structural object formed of the first buffer layer 24, second buffer layer 25, and second electrode 22 is preferably 10 MPa to 80 MPa in the imaging element and the electronic device, and it can be grasped that this can more surely suppress occurrence of stress damage on the light receiving layer and the like 23 at the time of forming the layered structural body 20.

TABLE 4

| | Power supply at the time of sputtering (W) | Oxygen gas partial pressure | Internal compressive stress (MPa) |
|---|---|---|---|
| Example 1C | 300 | 0.01 | 40 |
| Comparative Example 1D | | | 180 |
| Example 1C | 300 | 0.02 | 20 |
| Comparative Example 1D | | | 165 |
| Example 1C | 400 | 0.01 | 38 |
| Comparative Example 1D | | | 175 |
| Example 1C | 400 | 0.02 | 18 |
| Comparative Example 1D | | | 162 |

Figure 8:
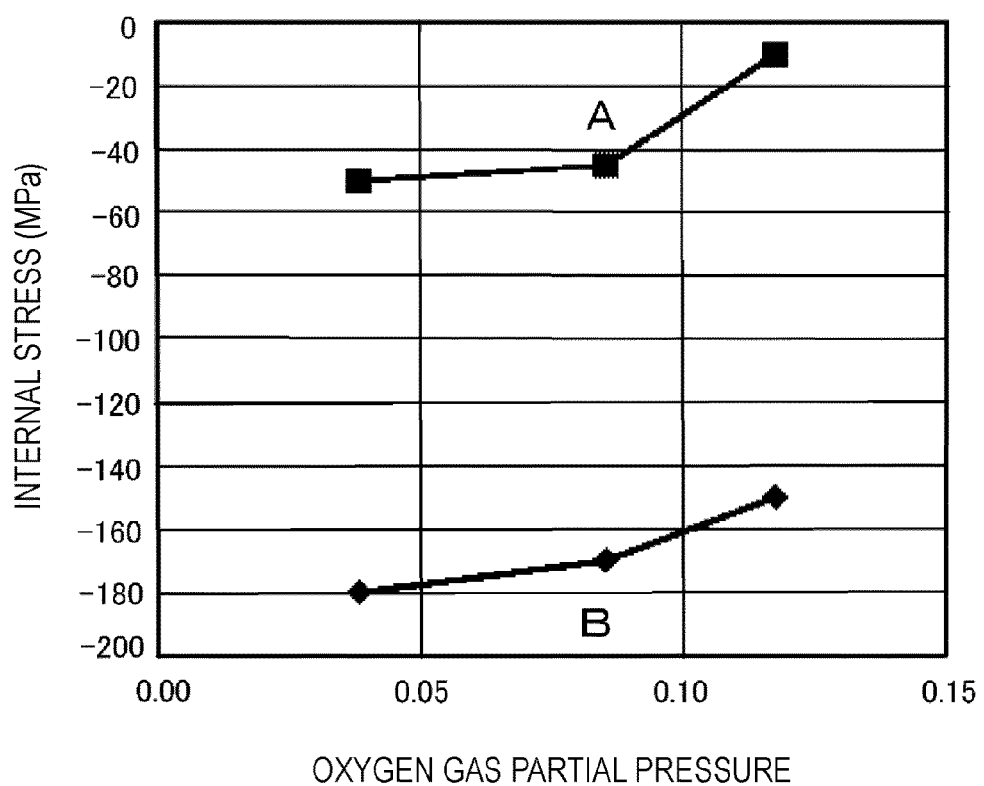
FIG. 8 is a graph illustrating a study result of a relation between oxygen gas partial pressure and internal compressive stress of the second electrode at the time of film formation of the second electrode in Example 1.

Additionally, study was made on a relation between the oxygen gas partial pressure and the internal compressive stress (compressive pressure) of the second electrode at the time of film formation of the second electrode 22. A parallel plate sputtering device or a DC magnetron sputtering device was used as the sputtering device, and argon (Ar) gas was used as process gas. Then, film formation of an IZO film (using an InZnO sintered body as a target) or an ITO film (using an ITO sintered body) was performed on the basis of the sputtering method at a room temperature (specifically, 22° C. to 28° C.). FIG. 8 illustrates results thereof, in which "A" represents data of the amorphous IZO film, and "B" represents data of the crystalline ITO film. Here, a horizontal axis in FIG. 8 represents the oxygen gas partial pressure <=($O_2$ gas pressure)/(total pressure of Ar gas and $O_2$ gas)>, and a vertical axis represents the internal compressive stress (unit: MPa) of the second electrode. It can be grasped from FIG. 8, the IZO film has internal compressive stress (compressive pressure) of 10 MPa to 50 MPa. On the other hand, it can be grasped that the ITO film has extremely high internal compressive stress such as 150 MPa to 180 MPa. In other words, a value of the internal compressive stress of the amorphous IZO film is significantly lower than a value of the internal compressive stress of the crystalline ITO film.

Figure 9A:
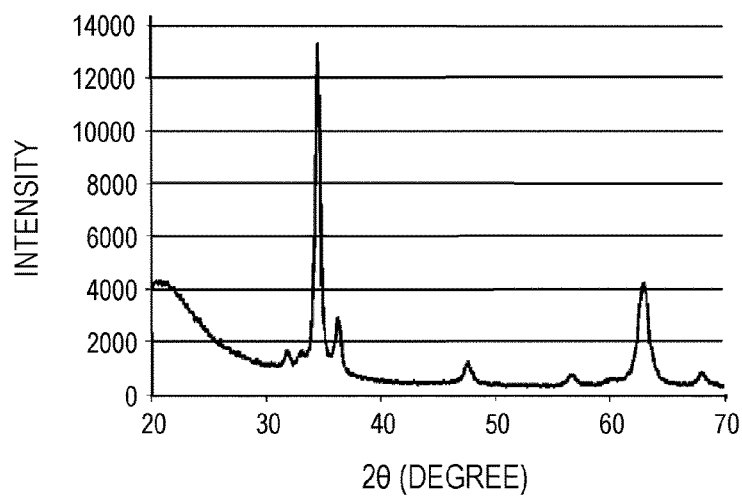
FIGS. 9A and 9B are charts respectively illustrating analysis results of X-ray diffraction of ITO, a material A, and a material B constituting the second buffer layer.
Figure 9B:
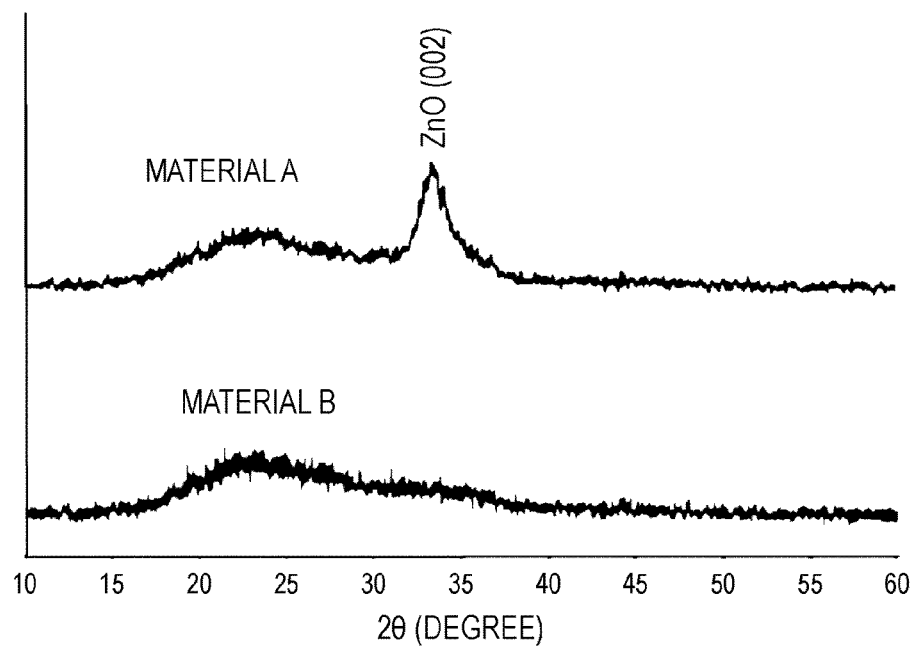

Additionally, an X-ray diffraction test was also performed for the second buffer layer 25. FIGS. 9A and 9B illustrate results thereof. Meanwhile, FIG. 9A is a chart illustrating an analysis result on X-ray diffraction of crystalline ZnO, and FIG. 9B is a chart illustrating an analysis result of X-ray diffraction of the material A and the material B. Whether the material is crystalline or amorphous can be determined by measuring, for example, a peak height of a ZnO (002) surface (measurement of diffraction intensity near 2θ=34.4°. It can be grasped from FIG. 9B that the second electrode formed of the material A or the material B in Example 1A and Example 1B is amorphous.

Figure 10A:
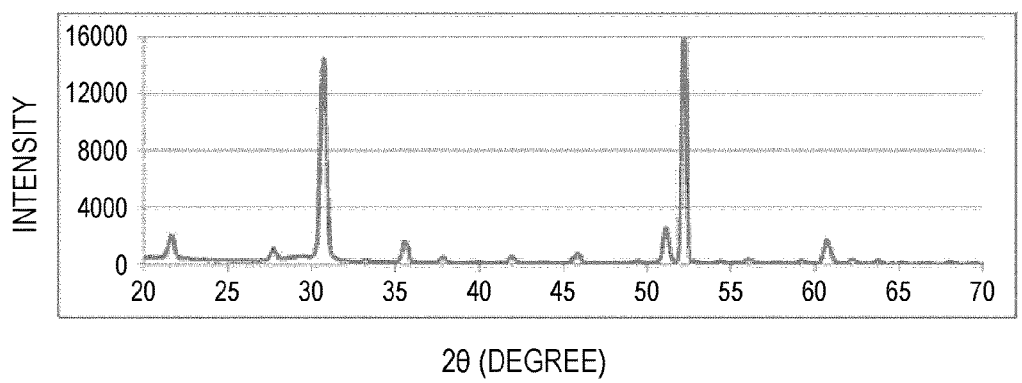
FIGS. 10A and 10B are charts respectively illustrating analysis results X-ray diffraction of ITO and the second electrode in Example 1.
Figure 10B:
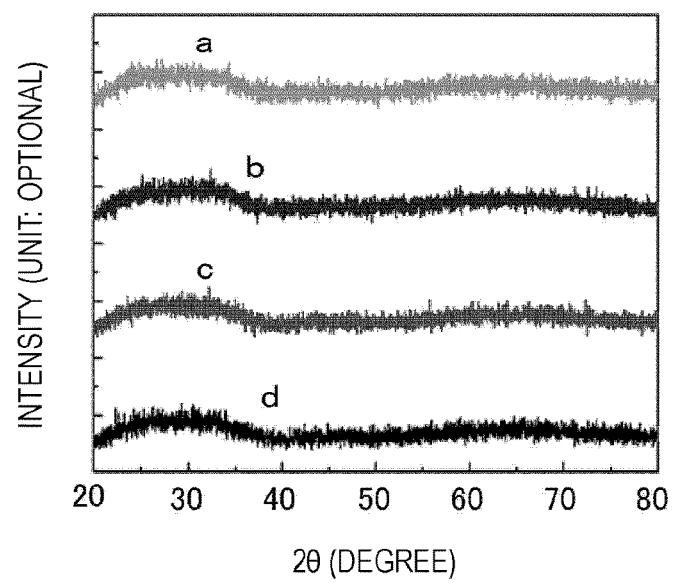

Furthermore, an X-ray diffraction test was also performed for the obtained second electrode. FIGS. 10A and 10B illustrate results thereof. Meanwhile, FIG. 10A is a chart illustrating an analysis result on X-ray diffraction of the second electrode formed of ITO, and FIG. 10B is a chart illustrating an analysis result of X-ray diffraction of the second electrode in Example 1. It can be grasped from FIG. 10B that the second electrode of Example 1 is amorphous regardless of the film forming conditions. Furthermore, it can be grasped from FIG. 10A that ITO has high crystallinity. Meanwhile, charts "a", "b", "c", "d" in FIG. 10B represent differences of the film forming conditions. The chart "a" represents data when sputtering power supply is 200 W, the chart "b" represents data when the sputtering power supply is 150 W, the chart "c" represents data when the sputtering power supply is 100 W, and the chart "d" represents data when the sputtering power supply is 50 W.

The second buffer layer was formed from various kinds of materials shown in Table 5 below, and evaluation tests were performed. Table 6 provides results thereof. Note that ionization potential was acquired by ultraviolet photoelectron spectroscopy (UPS). Additionally, a bandgap was calculated from an absorption edge. Furthermore, ΔE represents a difference between a HOMO value of the light receiving layer and the like and ionization potential of each buffer layer <ΔE=(HOMO value of light receiving layer and the like)−(value of ionization potential)>.

TABLE 5

| | Principal Component | Accessory Components |
|---|---|---|
| Example 1D | ZnO | $Al_2O_3$ and $SiO_2$ |
| Example 1E | ZnO | $Al_2O_3$ and MgO |
| Example 1F | ZnO | $Al_2O_3$ and $Nb_2O_5$ |
| Example 1G | ZnO | MgO and $SiO_2$ |

TABLE 6

| | Example 1D | Example 1E | Example 1F | Example 1G |
|---|---|---|---|---|
| Ionization Potential (eV) | 7.8 | 7.8 | 7.7 | 7.7 |
| Bandgap (eV) | 3.1 | 3.0 | 2.9 | 3.0 |
| Conduction Band (eV) | 4.7 | 4.8 | 4.8 | 4.7 |
| ΔE | 2.1 | 2.1 | 2.0 | 2.0 |

Even in the case where the second electrode 22 was formed of amorphous IGZO instead of IZO, the results similar to those described above were obtained.

As described above, in the imaging element and the electronic device of Example 1 or an imaging element and an electronic device in a solid-state imaging device of Example 3 described later, the single first buffer layer formed of an amorphous organic material is provided between the light receiving layer and the like and the second electrode. Therefore, the light receiving layer and the like is hardly damaged at the time of forming the second buffer layer, and electrons are easily exchanged between the second electrode and the light receiving layer and the like. Additionally, since the single second buffer layer formed of an amorphous inorganic material is provided, stress damages is hardly caused on the light receiving layer and the like at the time of forming the second electrode. Furthermore, as a result of the above, there is no risk of causing characteristics deterioration of the imaging element and the electronic device. Furthermore, since the second buffer layer is formed of an amorphous inorganic material, the second buffer layer has high transparency and low internal compressive stress. Additionally, since formation of an intermediate level is suppressed, generation of dark current can be reduced. Moreover, because of having the two-layer structure including the first buffer layer and the second buffer layer, a forming process is simplified and a forming time can be shortened.

Additionally, in the imaging element and the electronic device of Example 1, since a difference between the work function value of the first electrode and the work function value of the second electrode is prescribed, a large internal electric field can be generated in the light receiving layer and the like on the basis of the difference of the work function value at the time of applying bias voltage (more specifically, reverse bias voltage) between the second electrode and the first electrode. As a result, internal quantum efficiency can be improved, in other words, photocurrent can be increased, and furthermore, generation of dark current can be suppressed. Additionally, since the surface of the second electrode is smooth, surface scattering reflection at the second electrode can be suppressed. As a result, surface reflection of light entering the second electrode can be reduced, a light amount loss of the light entering the light receiving layer and the like via the second electrode can be suppressed, and bright current characteristics at the time of photoelectric conversion can be more improved.

EXAMPLE 2

Figure 1C:
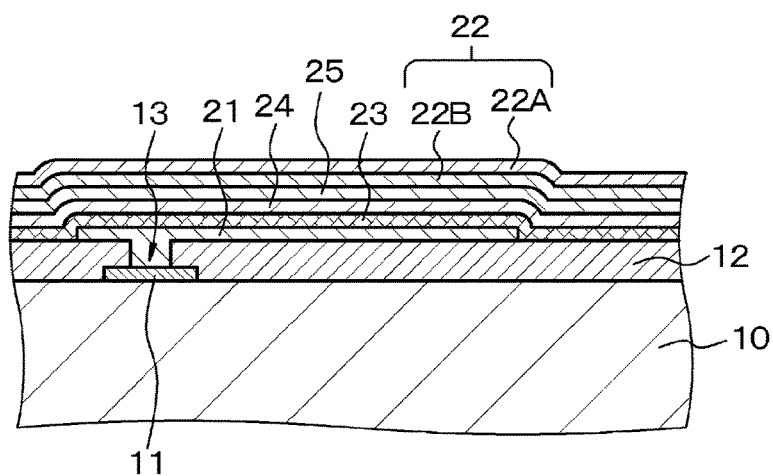
FIG. 1C is a schematic partial cross-sectional view of an imaging element and an electronic device of Example 2.

Example 2 is a modified example of Example 1. FIG. 1C illustrates a schematic partial cross-sectional view of an imaging element and an electronic device of Example 2.

In the imaging element and the electronic device of Example 2, a second electrode 22 includes a layered structure of a second B-layer 22B and a second A-layer 22A from a side of a light receiving layer and the like, and a work function value of the second A-layer 22A of the second electrode 22 is lower than a work function value of the second B-layer 22B of the second electrode 22. Specifically, a difference between a work function value of the second A-layer 22A of the second electrode 22 and a work function value of the second B-layer 22B of the second electrode 22 is 0.1 eV to 0.2 eV, more specifically, 0.15 eV, and a difference between a work function value of the first electrode 21 and the work function value of the second A-layer 22A of the second electrode 22 is 0.4 eV or more. Furthermore, the second electrode 22 has a thickness of $1 \times 10^{-8}$ m to $1.5 \times 10^{-7}$ m, specifically, 50 nm, and a ratio between a thickness of the second A-layer 22A of the second electrode 22 and a thickness of the second B-layer 22B of the second electrode 22 is 9/1 to 1/9, specifically, 9/1. In Example 2 also, since the difference between the work function value of the first electrode 21 and the work function value of the second A-layer 22 of the second electrode 22 is set to 0.4 eV or more, an internal electric field is generated in the light receiving layer and the like on the basis of the difference of the work function value, and internal quantum efficiency is improved. Here, when compositions of a second A-layer 22A are $In_a(Ga, Al)_b Zn_c O_d$ and compositions of the second B-layer 22B are $In_{a'}(Ga, Al)_{b'} Zn_{c'} O_{d'}$, a=a', b=b', c=c' are satisfied and also d<d' is satisfied.

According to an electrode forming method in the imaging element and the electronic device of Example 2, the work function values of the second A-layer 22A and the second B-layer 22B of the second electrode 22 are controlled by controlling an introduced amount of oxygen gas at the time of performing formation on the basis of the sputtering method in a step similar to [Step-110] of Example 1, for example, as illustrated in FIG. 3.

In the imaging element and the electronic device of Example 2, the second electrode is formed of the second A-layer and the second B-layer, and the difference between the work functions of the second A-layer and the second B-layer is prescribed. Therefore, the work function in the second electrode can be optimized, and carrier exchange (movement) is more facilitated.

EXAMPLE 3

Example 3 relates to a solid-state imaging device of the present disclosure. The solid-state imaging device of Example 3 includes a plurality of imaging elements (photoelectric converting elements) of Example 1 and Example 2.

Figure 11:
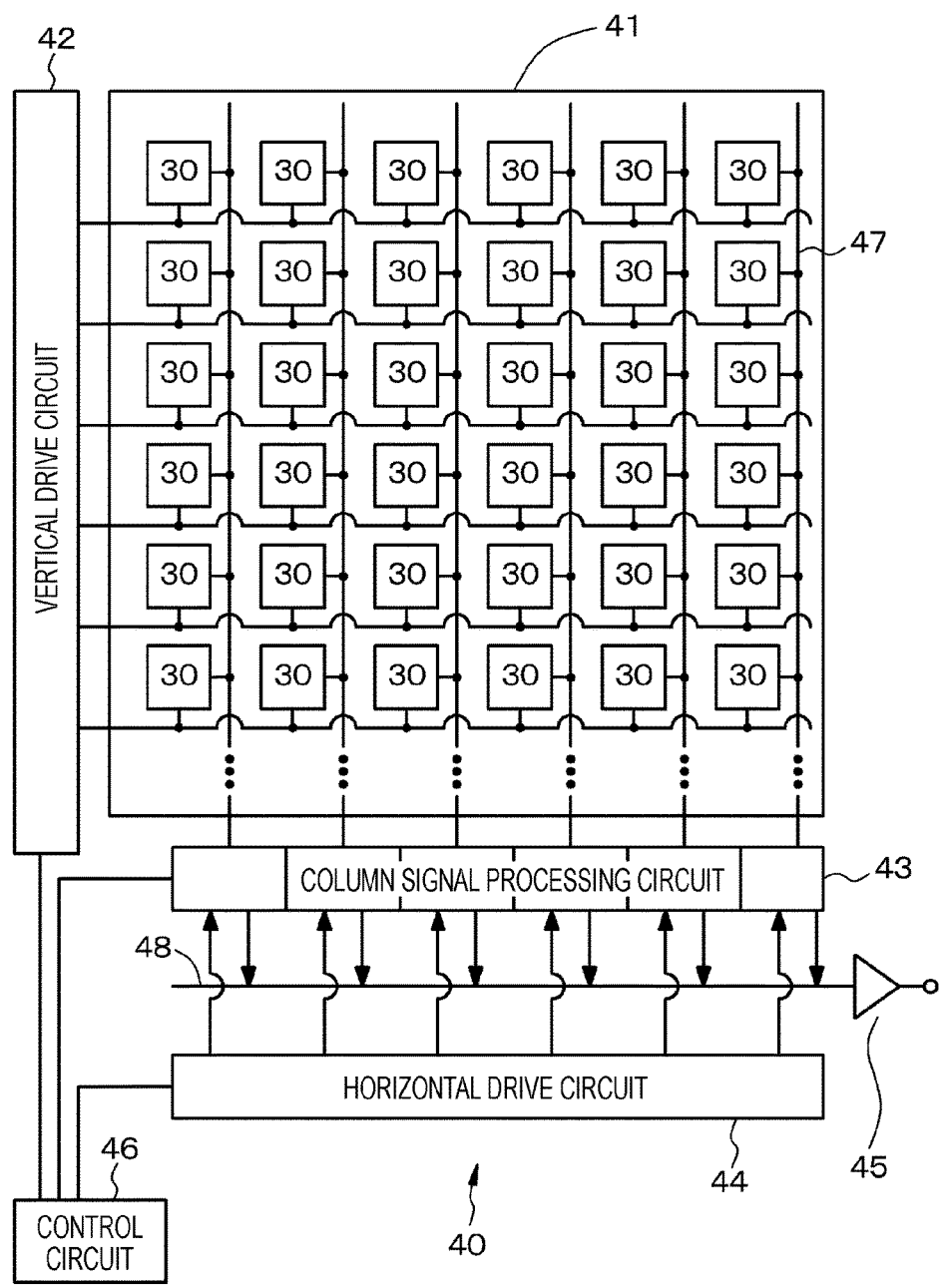
FIG. 11 is a conceptual diagram of a solid-state imaging device of Example 3.
Figure 12:
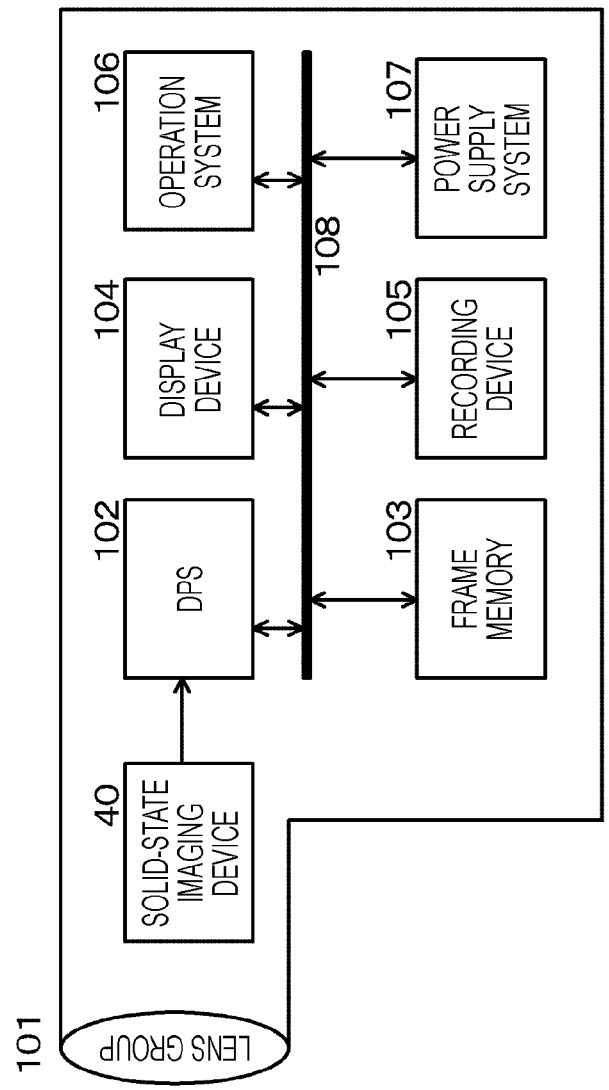
FIG. 12 is a diagram illustrating a configuration of the solid-state imaging device of Example 3.

FIG. 11 is a conceptual diagram of the solid-state imaging device of Example 3, and FIG. 12 illustrates a configuration of the solid-state imaging device of Example 3. A solid-state imaging device 100 of Example 3 is formed of a solid-state imaging device 40 and a known lens group 101, a digital signal processor (DSP) 102, a frame memory 103, a display device 104, a recording device 105, an operation system 106, a power supply system 107, and these components are electrically connected via a bus line 108. Furthermore, the solid-state imaging device 40 in Example 3 is formed of: an imaging area 41 in which imaging elements 30 described in Example 1 and Example 2 are arranged in a two-dimensional array form on a semiconductor substrate (e.g., silicon semiconductor substrate); a vertical drive circuit 42 as a peripheral circuit thereof; a column signal processing circuit 43; a horizontal drive circuit 44; an output circuit 45; a control circuit 46; and the like. Meanwhile, needless to mention that these circuits may be formed of known circuits or may be formed by using other circuit configurations (for example, various kinds of circuits used in a CCD imaging device or a CMOS imaging device in the related art).

The control circuit 46 generates a clock signal and a control signal to be reference of operation of the vertical drive circuit 42, column signal processing circuit 43, and horizontal drive circuit 44 on the basis of a vertical synchronization signal, a horizontal synchronization signal, and a master clock. Furthermore, the generated clock signal and control signal are received in the vertical drive circuit 42, column signal processing circuit 43, and horizontal drive circuit 44.

The vertical drive circuit 42 is formed of, for example, a shift register and selectively sequentially scans the respective imaging elements 30 line by line in the imaging area 41 in a vertical direction. Then, a pixel signal based on current (signal) generated in accordance with a received light amount in each of the imaging elements 30 is transmitted to a column signal processing circuit 43 via a vertical signal line 47.

The column signal processing circuit 43 is arranged in, for example, each column of the imaging elements 30 and applies, for each of the imaging elements, signal processing such as noise removal and signal amplification to signals output from the imaging elements 30 arrayed in one line in accordance with a signal from a black reference pixel (not illustrated but formed around an effective pixel region). An output stage of the column signal processing circuit 43 is provided with a horizontal selection switch (not illustrated) connected on the way to a horizontal signal line 48.

The horizontal drive circuit 44 is formed of, for example, a shift register and sequentially selects each of the respective column signal processing circuits 43 and outputs a signal from each of the column signal processing circuits 43 to the horizontal signal line 48 by sequentially outputting horizontal scanning pulses.

The output circuit 45 applies signal processing to the signals sequentially supplied from the respective column signal processing circuits 43 via the horizontal signal line 48, and outputs the same.

Since the light receiving layer and the like are adapted to directly function as color filters although depending on a material constituting the light receiving layer and the like, color separation can be performed without disposing a color filter. However, as the case may be, a known color filter that transmits a specific wavelength such as red, green, blue, cyan, magenta, yellow, or the like may also be disposed above a light incident side of the imaging element 30. Furthermore, the solid-state imaging device may be a front-illumination type or may also be a back-illumination type. Additionally, a shutter to control light incidence to the imaging element 30 may also be disposed depending on necessity.

While the description has been provided on the basis of the preferred Examples of the present disclosure, the present disclosure is not limited to such Examples. The structures, constitutions, manufacturing conditions, manufacturing methods, used materials in the imaging elements, electronic devices, and solid-state imaging device described in Examples are examples, and may be suitably modified. In the case of making the electronic device of the present disclosure function as a solar cell, light may be emitted to the light receiving layer and the like in a state that voltage is not applied between the second electrode and the first electrode. Additionally, an optical sensor or an image sensor may be formed by the electronic device of the present disclosure. In the case of forming the first buffer layer from anthracene and a derivative thereof (specifically, anthracene, for example) also, a result similar to the case of forming the first buffer layer from NBphen can be obtained.

Furthermore, the present disclosure may also take following constitutions.

[A01] Imaging Element

An imaging element including a layered structural body formed of: a first electrode; a light receiving layer formed on the first electrode; and a second electrode formed on the light receiving layer, wherein a single first buffer layer formed of an amorphous organic material and a single second buffer layer formed of an amorphous inorganic material are provided between the light receiving layer and the second electrode from the light receiving layer side.

[A02] The imaging element recited in [A01], wherein the second buffer layer is formed of a metal oxide or an oxide semiconductor.

[A03] The imaging element recited in [A02], wherein the second buffer layer is formed of at least two kinds of materials selected from a group consisting of a zinc oxide, a silicon oxide, a tin oxide, a niobium oxide, a titanium oxide, a molybdenum oxide, an aluminum oxide, an indium-doped gallium zinc oxide, a magnesium oxide, and a hafnium oxide.

[A04] The imaging element recited in [A03], wherein the second buffer layer is formed of a zinc oxide, an aluminum oxide, and a magnesium oxide, or a zinc oxide, an aluminum oxide, and a silicon oxide.

[A05] The imaging element recited in any one of [A01] to [A04], wherein the second buffer layer has a thickness of $3 \times 10^{-9}$ m to $3 \times 10^{-7}$ m.

[A06] The imaging element recited in any one of [A01] to [A05], wherein the second buffer layer has a sheet resistance value of $1 \times 10^5$ Ω/□ or more.

[A07] The imaging element recited in any one of [A01] to [A06], wherein the first buffer layer is formed of phenanthroline and a derivative thereof or anthracene and a derivative thereof.

[A08] The imaging element recited in any one of [A01] to [A07], wherein the first buffer layer has a thickness of $3 \times 10^{-9}$ m to $3 \times 10^{-7}$ m.

[A09] The imaging element recited in any one of [A01] to [A08], wherein the second electrode is formed of an amorphous oxide that is transparent and has conductivity.

[A10] The imaging element recited in any one of [A01] to [A09], wherein the second electrode is formed of a material obtained by adding or doping at least one kind of material selected from a group consisting of aluminum, gallium, tin, and indium to one kind of material selected from a group consisting of an indium oxide, a tin oxide, and a zinc oxide.

[A11] The imaging element recited in any one of [A01] to [A09], wherein the second electrode is formed of $In_a(Ga, Al)_b Zn_c O_d$.

[A12] The imaging element recited in any one of [A01] to [A09], wherein the second electrode is formed of an indium-gallium oxide, an indium-doped gallium zinc oxide, an aluminum oxide-doped zinc oxide, an indium-zinc oxide, or a gallium-doped zinc oxide.

[A13] The imaging element recited in any one of [A01] to [A12], wherein the first electrode is formed of an indium-tin oxide, an indium-zinc oxide, or a tin oxide.

[A14] The imaging element recited in any one of [A01] to [A13], wherein a work function value of the second electrode has a work function of 4.5 eV or less.

[A15] The imaging element recited in [A14], wherein the second electrode has the work function value of 4.1 eV to 4.5 eV.

[A16] The imaging element recited in [A14] or [A15], wherein a difference between the work function value of the second electrode and a work function value of the first electrode is 0.4 eV or more.

[A17] The imaging element recited in [A16], wherein an internal electric field is generated in the light receiving layer on the basis of the difference of the work function value, and internal quantum efficiency is improved by setting the difference between the work function value of the first electrode and the work function value of the second electrode to 0.4 eV or more. [A18] The imaging element recited in any one of [A01] to [A13], wherein the second electrode includes a layered structure of a second B-layer and a second A-layer from the light receiving layer side, and a work function value of the second A-layer of the second electrode is lower than a work function value of the second B-layer of the second electrode.

[A19] The imaging element recited in [A18], wherein the difference between the work function value of the second A-layer of the second electrode and the work function value of the second B-layer of the second electrode is 0.1 eV to 0.2 eV.

[A20] The imaging element recited in [A18] or [A19], wherein the difference between the work function value of the first electrode and the work function value of the second A-layer of the second electrode is 0.4 eV or more.

[A21] The imaging element recited in [A20], wherein an internal electric field is generated in the light receiving layer on the basis of the difference of the work function value and internal quantum efficiency is improved by setting the difference between the work function value of the first electrode and the work function value of the second A-layer of the second electrode to 0.4 eV or more.

[A22] The imaging element recited in any one of [A18] to [A21], wherein the second electrode has a thickness of $1 \times 10^{-8}$ m to $1.5 \times 10^{-7}$ m, and a ratio between a thickness of the second A-layer of the second electrode and a thickness of the second B-layer of the second electrode is 9/1 to 1/9.

[A23] The imaging element recited in any one of [A01] to [A22], wherein the work function value of the second electrode is controlled by controlling an introduced amount of oxygen gas at the time of forming the second electrode on the basis of the sputtering method.

[A24] The imaging element recited in any one of [A01] to [A23], wherein an oxygen content rate is smaller than an oxygen content rate of a stoichiometric composition in the second electrode.

[A25] The imaging element recited in any one of [A01] to [A24], wherein the second electrode has a thickness of $1 \times 10^{-8}$ m to $1.5 \times 10^{-7}$ m. [A26] The imaging element recited in [A25], wherein the second electrode has a thickness of $2 \times 10^{-8}$ m to $1 \times 10^{-7}$ m.

[A27] The imaging element recited in any one of [A01] to [A26], wherein a refraction index of the second electrode and a refraction index of the second buffer layer are 1.9 to 2.2. [A28] The imaging element recited in [A27], wherein a difference between the refraction index of the second electrode and the refraction index of the second buffer layer is 0.3 or less.

[A29] The imaging element recited in any one of [A01] to [A28], wherein the second electrode has surface roughnesses Ra of 1.5 nm or less and Rq of 2.5 nm or less

[A30] The imaging element recited in any one of [A01] to [A29], wherein the second electrode has an electric resistance value of $1 \times 10^{-6}$ Ω·cm or less. [A31] The imaging element recited in any one of [A01] to [A30], wherein the second electrode has a sheet resistance value of $3 \times 10$ Ω/□ to $1 \times 10^3$ Ω/∈.

[A32] The imaging element recited in any one of [A01] to [A31], wherein internal compressive stress of a layered structural object formed of the first buffer layer, the second buffer layer, and the second electrode is 10 MPa to 80 MPa.

[A33] The imaging element recited in any one of [A01] to [A32], wherein transparency of the second buffer layer is controlled by controlling oxygen gas partial pressure at the time of forming the second buffer layer on the basis of a sputtering method.

[A34] The imaging element recited in any one of [A01] to [A33], wherein $J_{d-5}/J_{d-0} \leq 2$ is satisfied in the case of defining a value of dark current flowing between the first electrode and the second electrode as $J_{d-0}$ (amperes) at the time of applying 0 V between the first electrode and the second electrode, and defining a value of dark current flowing between the first electrode and the second electrode as $J_{d-5}$ (amperes) at the time of applying 5 V between the first electrode and the second electrode. [A35] The imaging element recited in any one of [A01] to [A34], wherein light transmissivity of the second electrode to light having a wavelength of 400 nm to 660 nm is 75% or more.

[B01] Solid-State Imaging Device

A solid-state imaging device including a plurality of imaging elements, wherein each of the imaging elements has a layered structural body formed of: a first electrode; a light receiving layer formed on the first electrode; and a second electrode formed on the light receiving layer, and a single first buffer layer formed of an amorphous organic material and a single second buffer layer formed of an amorphous inorganic material are provided between the light receiving layer and the second electrode from the light receiving layer side.

[B02] Solid-State Imaging Device

A solid-state imaging device including a plurality of imaging elements recited in any one of [A01] to [A35].

[C01] Electronic Device

An electronic device including: a light emitting/light receiving layer; a first electrode electrically connected to the light emitting/light receiving layer; and a second electrode formed on the light emitting/light receiving layer and formed of a transparent conductive material, wherein a single first buffer layer formed of an amorphous organic material and a single second buffer layer formed of an amorphous inorganic material are provided between the light emitting/light receiving layer and the second electrode from the light emitting/light receiving layer side. [C02] The electronic device recited in [C01], wherein the second buffer layer is formed of a metal oxide or an oxide semiconductor.

[C03] The electronic device recited in [C02], wherein the second buffer layer is formed of at least two kinds of materials selected from a group consisting of a zinc oxide, a silicon oxide, a tin oxide, a niobium oxide, a titanium oxide, a molybdenum oxide, an aluminum oxide, an indium-doped gallium zinc oxide, a magnesium oxide, and a hafnium oxide.

[C04] The electronic device recited in [C03], wherein the second buffer layer is formed of a zinc oxide, an aluminum oxide, and a magnesium oxide, or a zinc oxide, an aluminum oxide, and a silicon oxide.

[C05] The electronic device recited in any one of [C01] to [C04], wherein the second buffer layer has a thickness of $3 \times 10^{-9}$ m to $3 \times 10^{-7}$ m.

[C06] The electronic device recited in any one of [C01] to [C05], wherein the second buffer layer has a sheet resistance value of $1 \times 10^5$ Ω/□ or more.

[C07] The electronic device recited in any one of [C01] to [C06], wherein the first buffer layer is formed of phenanthroline and a derivative thereof or anthracene and a derivative thereof.

[C08] The electronic device recited in any one of [C01] to [C07], wherein the first buffer layer has a thickness of $3 \times 10^9$ m to $3 \times 10^{-7}$ m.

[C09] The electronic device recited in any one of [C01] to [C08], wherein the second electrode is formed of an amorphous oxide that is transparent and has conductivity.

[C10] The electronic device recited in any one of [C01] to [C09], wherein the second electrode is formed of a material obtained by adding or doping at least one kind of material selected from a group consisting of aluminum, gallium, tin, and indium to one kind of material selected from a group consisting of an indium oxide, a tin oxide, and a zinc oxide.

[C11] The electronic device recited in any one of [C01] to [C09], wherein the second electrode is formed of $In_a(Ga, Al)_b Zn_c O_d$.

[C12] The electronic device recited in any one of [C01] to [C09], wherein the second electrode is formed of an indium-gallium oxide, an indium-doped gallium zinc oxide, an aluminum oxide-doped zinc oxide, an indium-zinc oxide, or a gallium-doped zinc oxide.

[C13] The electronic device recited in any one of [C01] to [C12], wherein the first electrode is formed of an indium-tin oxide, an indium-zinc oxide, or a tin oxide. [C14] The electronic device recited in any one of [C01] to [C13], wherein a work function value of the second electrode has a work function of 4.5 eV or less.

[C15] The electronic device recited in [C14], wherein the second electrode has the work function value of 4.1 eV to 4.5 eV.

[C16] The electronic device recited in [C14] or [C15], wherein a difference between the work function value of the second electrode and a work function value of the first electrode is 0.4 eV or more. [C17] The electronic device recited in [C16], wherein an internal electric field is generated in the light receiving layer on the basis of the difference of the work function value, and internal quantum efficiency is improved by setting the difference between the work function value of the first electrode and the work function value of the second electrode to 0.4 eV or more.

[C18] The electronic device recited in any one of [C01] to [C13], wherein the second electrode includes a layered structure of a second B-layer and a second A-layer from the light receiving layer side, and a work function value of the second A-layer of the second electrode is lower than a work function value of the second B-layer of the second electrode.

[C19] The electronic device recited in [C18], wherein the difference between the work function value of the second A-layer of the second electrode and the work function value of the second B-layer of the second electrode is 0.1 eV to 0.2 eV.

[C20] The electronic device recited in [C18] or [C19], wherein the difference between the work function value of the first electrode and the work function value of the second A-layer of the second electrode is 0.4 eV or more.

[C21] The electronic device recited in [C20], wherein an internal electric field is generated in the light receiving layer on the basis of the difference of the work function value and internal quantum efficiency is improved by setting the difference between the work function value of the first electrode and the work function value of the second A-layer of the second electrode to 0.4 eV or more. [C22] The electronic device recited in any one of [C18] to [C21], wherein the second electrode has a thickness of $1 \times 10^{-8}$ m to $1.5 \times 10^{-7}$ m, and a ratio between a thickness of the second A-layer of the second electrode and a thickness of the second B-layer of the second electrode is 9/1 to 1/9.

[C23] The electronic device recited in any one of [C01] to [C22], wherein the work function value of the second electrode is controlled by controlling an introduced amount of oxygen gas at the time of forming the second electrode on the basis of the sputtering method.

[C24] The electronic device recited in any one of [C01] to [C23], wherein an oxygen content rate is smaller than an oxygen content rate of a stoichiometric composition in the second electrode.

[C25] The electronic device recited in any one of [C01] to [C24], wherein the second electrode has a thickness of $1 \times 10^{-8}$ m to $1.5 \times 10^{-7}$ m.

[C26] The electronic device recited in [C25], wherein the second electrode has a thickness of $2 \times 10^{-8}$ m to $1 \times 10^{-7}$ m.

[C27] The electronic device recited in any one of [C01] to [C26], wherein a refraction index of the second electrode and a refraction index of the second buffer layer are 1.9 to 2.2.

[C28] The electronic device recited in [C27], wherein a difference between the refraction index of the second electrode and the refraction index of the second buffer layer is 0.3 or less.

[C29] The electronic device recited in any one of [C01] to [C28], wherein the second electrode has surface roughnesses Ra of 1.5 nm or less and Rq of 2.5 nm or less

[C30] The electronic device recited in any one of [C01] to [C29], wherein the second electrode has an electric resistance value of $1\times10^{-6}$ Ω·cm or less.

[C31] The electronic device recited in any one of [C01] to [C30], wherein the second electrode has a sheet resistance value of $3\times10$ Ω/☐ to $1\times10^3$ Ω/☐.

[C32] The electronic device recited in any one of [C01] to [C31], wherein internal compressive stress of a layered structural object formed of the first buffer layer, the second buffer layer, and the second electrode is 10 MPa to 80 MPa.

[C33] The electronic device recited in any one of [C01] to [C32], wherein transparency of the second buffer layer is controlled by controlling oxygen gas partial pressure at the time of forming the second buffer layer on the basis of a sputtering method.

[C34] The electronic device recited in any one of [C01] to [C33], wherein $J_{d-5}/J_{d-0} \leq 2$ is satisfied in the case of defining a value of dark current flowing between the first electrode and the second electrode as $J_{d-0}$ (amperes) at the time of applying 0 V between the first electrode and the second electrode, and defining a value of dark current flowing between the first electrode and the second electrode as $J_{d-5}$ (amperes) at the time of applying 5 V between the first electrode and the second electrode.

[C35] The electronic device recited in any one of [C01] to [C34], wherein light transmissivity of the second electrode to light having a wavelength of 400 nm to 660 nm is 75% or more.

REFERENCE SIGNS LIST

10 Substrate
11 Wire
12 Insulation layer
13 Opened portion
21 First electrode
22 Second Electrode
22A Second A-layer of second electrode
22B Second B-layer of second electrode
23 Light receiving layer or light emitting/light receiving layer (light receiving layer and the like)
30 Imaging element
40 Solid-state imaging device
41 Imaging area
42 Vertical drive circuit
43 Column signal processing circuit
44 Horizontal drive circuit
45 Output circuit
46 Control circuit
47 Vertical signal line
48 Horizontal signal line
101 Lens group
102 Digital signal processor (DSP)
103 Frame memory
104 Display device
105 Recording device
106 Operation system
107 Power supply system
108 Bus line

What is claimed is:

1. An imaging element comprising a layered structural body formed of: a first electrode; a light receiving layer formed on the first electrode; and a second electrode formed on the light receiving layer,
wherein a single first buffer layer formed of an amorphous organic material and a single second buffer layer formed of an amorphous inorganic material are provided between the light receiving layer and the second electrode from the light receiving layer side, and
wherein a refraction index of the second electrode and a refraction index of the second buffer layer are 1.9 to 2.2.

2. The imaging element according to claim 1, wherein the second buffer layer is formed of a metal oxide or an oxide semiconductor.

3. The imaging element according to claim 2, wherein the second buffer layer is formed of at least two kinds of materials selected from a group consisting of a zinc oxide, a silicon oxide, a tin oxide, a niobium oxide, a titanium oxide, a molybdenum oxide, an aluminum oxide, an indium-doped gallium zinc oxide, a magnesium oxide, and a hafnium oxide.

4. The imaging element according to claim 3, wherein the second buffer layer is formed of a zinc oxide, an aluminum oxide, and a magnesium oxide, or a zinc oxide, an aluminum oxide, and a silicon oxide.

5. The imaging element according to claim 1, wherein the second buffer layer has a thickness of $3\times10^{-9}$ m to $3\times10^{-7}$ m.

6. The imaging element according to claim 1, wherein the second buffer layer has a sheet resistance value of $1\times10^5$ Ω/☐ or more.

7. The imaging element according to claim 1, wherein the first buffer layer is formed of phenanthroline and a derivative thereof or anthracene and a derivative thereof.

8. The imaging element according to claim 1, wherein the first buffer layer has a thickness of $3\times10^{-9}$ m to $3\times10^{-7}$ m.

9. The imaging element according to claim 1, wherein the second electrode is formed of an amorphous oxide that is transparent and has conductivity.

10. The imaging element according to claim 1, wherein the second electrode is formed of a material obtained by adding or doping at least one kind of material selected from a group consisting of aluminum, gallium, tin, and indium to one kind of material selected from a group consisting of an indium oxide, a tin oxide, and a zinc oxide.

11. The imaging element according to claim 10, wherein a work function value of the second electrode has a work function of 4.5 eV or less.

12. The imaging element according to claim 1, wherein the second electrode has a thickness of $1\times10^{-8}$ m to $1.5\times10^{-7}$ m.

13. The imaging element according to claim 12, wherein the second electrode has a thickness of $2\times10^{-8}$ m to $1\times10^{-7}$ m.

14. The imaging element according to claim 1, wherein the second electrode has surface roughnesses Ra of 1.5 nm or less and Rq of 2.5 nm or less.

15. The imaging element according to claim 1, wherein the second electrode has an electric resistance value of $1\times10^{-6}$ Ω·cm or less.

16. The imaging element according to claim 1, wherein internal compressive stress of a layered structural object formed of the first buffer layer, the second buffer layer, and the second electrode is 10 MPa to 80 MPa.

17. The imaging element according to claim 1, wherein transparency of the second buffer layer is controlled by controlling oxygen gas partial pressure at the time of forming the second buffer layer on the basis of a sputtering method.

18. A solid-state imaging device comprising a plurality of imaging elements, wherein
each of the imaging elements has a layered structural body formed of: a first electrode; a light receiving layer formed on the first electrode; and a second electrode formed on the light receiving layer, and a single first buffer layer formed of an amorphous organic material and a single second buffer layer formed of an amorphous inorganic material are provided between the light receiving layer and the second electrode from the light receiving layer side, and wherein a refraction index of the second electrode and a refraction index of the second buffer layer are 1.9 to 2.2.

19. An electronic device comprising: a light emitting/light receiving layer; a first electrode electrically connected to the light emitting/light receiving layer; and a second electrode formed on the light emitting/light receiving layer and formed of a transparent conductive material, wherein a single first buffer layer formed of an amorphous organic material and a single second buffer layer formed of an amorphous inorganic material are provided between the light emitting/light receiving layer and the second electrode from the light emitting/light receiving layer side, and wherein a refraction index of the second electrode and a refraction index of the second buffer layer are 1.9 to 2.2.

\* \* \* \* \*